(12) United States Patent
Gu et al.

(10) Patent No.: US 12,316,135 B2
(45) Date of Patent: May 27, 2025

(54) ELECTRONIC DEVICE FOR WIRELESSLY TRANSMITTING POWER INCLUDING A PLURALITY OF COILS, AND METHOD OF OPERATING THE SAME

(71) Applicant: Samsung Electronics Co., Ltd., Suwon-si (KR)

(72) Inventors: Beomwoo Gu, Suwon-si (KR); Jaehyun Park, Suwon-si (KR); Jaeseok Park, Suwon-si (KR); Kangho Byun, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 18/364,403

(22) Filed: Aug. 2, 2023

(65) Prior Publication Data

US 2024/0055901 A1  Feb. 15, 2024

Related U.S. Application Data

(63) Continuation of application No. PCT/KR2023/009701, filed on Jul. 7, 2023.

(30) Foreign Application Priority Data

Aug. 9, 2022 (KR) .................. 10-2022-0099060

(51) Int. Cl.
*H02J 50/12* (2016.01)
*H03H 7/01* (2006.01)
*H03H 7/38* (2006.01)

(52) U.S. Cl.
CPC ........... *H02J 50/12* (2016.02); *H03H 7/1741* (2013.01); *H03H 7/38* (2013.01)

(58) Field of Classification Search
CPC ........ H02J 50/12; H02J 50/80; H03H 7/1741; H03H 7/38; H03H 7/0115; H03H 7/175; H03H 7/1758

(Continued)

(56) References Cited

U.S. PATENT DOCUMENTS

2008/0211320 A1  9/2008  Cook et al.
2009/0015075 A1  1/2009  Cook et al.

(Continued)

FOREIGN PATENT DOCUMENTS

KR       20140070705 A     6/2014
KR    10-2015-0123711 A    11/2015

(Continued)

OTHER PUBLICATIONS

PCT International Search Report dated Oct. 12, 2023 for PCT/KR2023/009701.
PCT Written Opinion dated Oct. 12, 2023 for PCT/KR2023/009701.

*Primary Examiner* — Richard Tan
(74) *Attorney, Agent, or Firm* — Nixon & Vanderhye P.C.

(57) ABSTRACT

An electronic device for wirelessly transmitting power may include a first resonator including a first coil, a second resonator including a second coil having a different size from the first coil, an impedance matching circuit including at least one capacitor connected through a switch, and a controller. The controller may be configured to identify which one of a first electronic device not mounted on the electronic device and a second electronic device mounted on the electronic device power is to be transmitted to. The controller may be configured to, when power is to be transmitted to the first electronic device, transmit power through the first resonator by opening the switch. The controller may be configured to, when power is to be (Continued)

transmitted to the second electronic device, transmit power through the second resonator by closing the switch.

20 Claims, 17 Drawing Sheets

(58) Field of Classification Search
USPC ........................................................ 307/104
See application file for complete search history.

(56) References Cited

U.S. PATENT DOCUMENTS

| | | | |
|---|---|---|---|
| 2014/0084703 A1 | 3/2014 | Hall et al. | |
| 2014/0117760 A1 | 5/2014 | Baarman et al. | |
| 2014/0159652 A1 | 6/2014 | Hall et al. | |
| 2015/0311728 A1 | 10/2015 | Yun et al. | |
| 2015/0372495 A1 | 12/2015 | McCauley et al. | |
| 2016/0221441 A1 | 8/2016 | Hall et al. | |
| 2017/0129347 A1 | 5/2017 | Kotani | |
| 2017/0288444 A1 | 10/2017 | Komulainen et al. | |
| 2018/0159359 A1 | 6/2018 | Park et al. | |
| 2018/0198322 A1 | 7/2018 | Mercier et al. | |
| 2018/0205268 A1 | 7/2018 | Park | |
| 2020/0244108 A1* | 7/2020 | Kim | H04B 5/79 |
| 2021/0351627 A1 | 11/2021 | Park et al. | |

FOREIGN PATENT DOCUMENTS

| | | | |
|---|---|---|---|
| KR | 10-2016-0017626 A | | 2/2016 |
| KR | 10-2017-0047080 A | | 5/2017 |
| KR | 10-2020-0058986 A | | 5/2020 |
| KR | 10-2022-0021093 A | | 2/2022 |
| KR | 20220021093 | * | 2/2022 |

* cited by examiner

ELECTRONIC DEVICE FOR WIRELESSLY TRANSMITTING POWER INCLUDING A PLURALITY OF COILS, AND METHOD OF OPERATING THE SAME

CROSS REFERENCE TO RELATED APPLICATIONS

This application is a bypass continuation application of International Application No. PCT/KR2023/009701, filed on Jul. 7, 2023, which is based on and claims the benefit of a Korean Patent Application No. 10-2022-0099060, filed on Aug. 9, 2022, in the Korean Intellectual Property Office, the disclosures of which are all hereby incorporated by reference herein in their entireties.

BACKGROUND

Field

Certain example embodiments relate to an electronic device for wirelessly transmitting power, which includes a plurality of coils, and/or a method of operating the same.

Description of Related Art

Wireless charging technology refers to a technology of automatically charging a battery of a portable phone by simply placing the portable phone on a wireless power transmission device (e.g., a charging pad) without connecting the portable phone to a separate charging connector. This wireless charging technology may enhance waterproofing due to no need for a connector for supplying power to an electronic product and increase the portability of an electronic device due to no need for a wired charger.

Along with the development of the wireless charging technology, methods of supplying power to various electronic devices (e.g., wireless power reception devices) and charging them with the power by a single electronic device (e.g., a wireless power transmission device) are under study. The wireless charging technology includes an electromagnetic induction scheme, a resonance scheme using resonance, and a radio frequency (RF)/microwave radiation scheme of converting electrical energy into microwaves and transferring the microwaves.

For example, the wireless charging technology based on electromagnetic induction or resonance has been used mainly in electronic devices such as smartphones. When a power transmitting unit (PTU) (e.g., a wireless power transmission device) and a power receiving unit (PRU) (e.g., a wireless power reception device) come in to contact with each other or approach each other within a specific distance, a battery of the PRU may be charged based on electromagnetic induction or electromagnetic resonance between a transmission coil (or a transmission resonator) of the PTU and a reception coil (or a reception resonator) of the PRU.

SUMMARY

According to an embodiment, an electronic device for wirelessly transmitting power may include a first resonator including a first coil, a second resonator including a second coil having a different size from the first coil, an impedance matching circuit including at least one capacitor connected, directly or indirectly, through a switch, and a controller comprising processing circuitry such as at least one processor. According to an embodiment, the controller may be configured to identify which one of a first electronic device not mounted on the electronic device and a second electronic device mounted on the electronic device power is to be transmitted to. According to an embodiment, the controller may be configured to, when power is to be transmitted to the first electronic device, transmit power through the first resonator by opening the switch. According to an embodiment, the controller may be configured to, when power is to be transmitted to the second electronic device, transmit power through the second resonator by closing the switch.

According to an embodiment, a method of operating an electronic device for transmitting power wirelessly may include identifying which one of a first electronic device not mounted on the electronic device and a second electronic device mounted on the electronic device power is to be transmitted to. The electronic device may include a first coil and a second coil having different sizes. According to an embodiment, the method of operating an electronic device for transmitting power wirelessly may include, when power is to be transmitted to the first electronic device, transmitting power through a first resonator including the first coil by opening a switch included in an impedance matching circuit included in the electronic device. The switch may be connected, directly or indirectly, to at least one capacitor. According to an embodiment, the method of operating an electronic device for transmitting power wirelessly may include, when power is to be transmitted to the second electronic device, transmitting power through a second resonator including the second coil by closing the switch.

BRIEF DESCRIPTION OF THE DRAWINGS

The foregoing and other features of example embodiments will become more apparent from the following detailed description of embodiments when read in conjunction with the accompanying drawings. In the drawings, like reference numerals refer to like elements.

DETAILED DESCRIPTION

Figure 1:
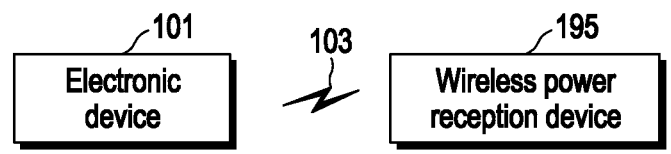
FIG. 1 is a block diagram illustrating an electronic device that wirelessly transmits power and a wireless power reception device according to various embodiments.

FIG. 1 is a block diagram illustrating an electronic device that wirelessly transmits power and a wireless power reception device according to various embodiments.

Referring to FIG. 1, an electronic device 101 according to various embodiments may wirelessly transmit power 103 to a wireless power reception device 195. In an example, the electronic device 101 may transmit the power 103 according to an induction scheme. When the electronic device 101 operates according to the induction scheme, the electronic device 101 may include, for example, a power source, a direct current-alternating current (DC-AC) conversion circuit, an amplifier circuit, an impedance matching circuit, at least one capacitor, at least one coil, a communication modulation/demodulation circuit, and so on. At least one capacitor together with at least one coil may form a resonant circuit. The electronic device 101 may be implemented in a manner defined in the wireless power consortium (WPC) standard (or the Qi standard). In another example, the electronic device 101 may transmit the power 103 according to a resonance scheme. In the case of the resonance scheme, the electronic device 101 may include, for example, a power source, a DC-AC conversion circuit, an amplifier circuit, an impedance matching circuit, at least one capacitor, at least one coil, an out-of-band (OOB) communication circuit (e.g., a Bluetooth low energy (BLE) communication circuit), and so on. At least one capacitor and at least one coil may form a resonant circuit. The electronic device 101 may be implemented in a manner defined in the alliance for wireless power (A4WP) standard (or the air fuel alliance (AFA) standard). The electronic device 101 may include a coil capable of generating an induced magnetic field, when current flows according to the resonance scheme or the induction scheme. A process of generating an induced magnetic field by the electronic device 101 may be expressed as wireless transmission of the power 103 from the electronic device 101. In addition, the wireless power reception device 195 may include a coil in which an induced electromotive force is generated by a magnetic field with a time-variant magnitude, which is formed around the coil. A process of generating an induced electromotive force through a coil may be expressed as wireless reception of the power 103 at the wireless power reception device 195. For example, the electronic device 101 may be implemented in a manner defined in the airfuel inductive (e.g., power matters alliance (PMA)) or airfuel resonant (e.g., rezence) standard or the Qi standard as a standard for wireless power transmission.

The electronic device 101 according to various embodiments may communicate with the wireless power reception device 195. For example, the electronic device 101 may communicate with the wireless power reception device 195 according to an in-band (IB) scheme. The electronic device 101 may modulate data to be transmitted according to, for example, a frequency shift keying (FSK) modulation scheme, and the wireless power reception device 195 may perform modulation according to an amplitude shift keying (ASK) modulation scheme. The electronic device 101 and/or the wireless power reception device 195 may determine data transmitted from the other device based on the frequency and/or amplitude of the current, voltage, or power of a coil. An operation of performing modulation based on the ASK modulation scheme and/or the FSK modulation scheme may be understood as an operation of transmitting data according to the IB communication scheme. An operation of determining data transmitted from the other device by performing demodulation based on the frequency and/or amplitude of the current, voltage, or power of a coil may be understood as an operation of receiving data according to the IB communication scheme. For example, the electronic device 101 may communicate with the wireless power reception device 195 according to an OOB scheme. The electronic device 101 or the wireless power reception device 195 may transmit and receive data using a communication circuit (e.g., a BLE communication module) provided separately from a coil or a patch antenna.

In the disclosure, when it is said that the electronic device 101 or the wireless power reception device 195 performs a specific operation, this may imply that various hardware included in the electronic device 101 or the wireless power reception device 195, for example, a control circuit such as a processor (e.g., a transmission integrated circuit (IC) and/or a micro controlling unit (MCU)) or a coil performs the specific operation. Alternatively, when it is said that the electronic device 101 or the wireless power reception device 195 performs a specific operation, this may imply that the processor controls other hardware to perform the specific operation. Alternatively, when it is said that the electronic device 101 or the wireless power reception device 195 performs a specific operation, this may imply that as at least one instruction for performing the specific operation, stored in a storage circuit (e.g., memory) of the electronic device 101 or the wireless power reception device 195 is executed, the at least one execution causes the processor or other hardware to perform the specific operation.

Figure 2:
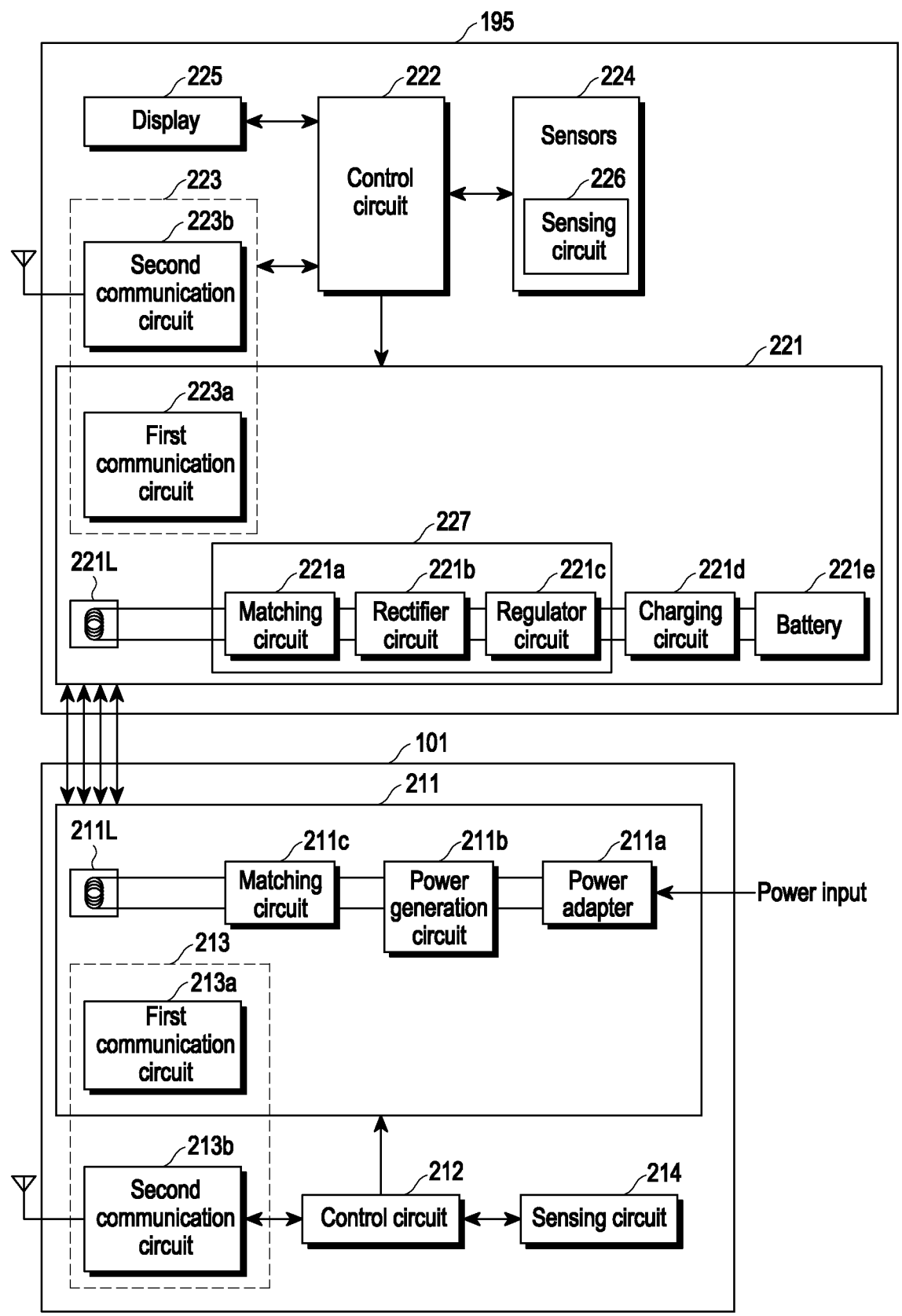
FIG. 2 is a block diagram illustrating a wireless charging system according to various embodiments.

FIG. 2 is a block diagram illustrating a wireless charging system according to various embodiments.

Referring to FIG. 2, the wireless charging system according to various embodiments may include the electronic device 101 and the wireless power reception device 195. For example, when the wireless power reception device 195 is mounted on the electronic device 101, the electronic device 101 may wirelessly supply power to the wireless power reception device 195.

According to various embodiments, the electronic device 101 may include a power transmission circuit 211, a control circuit 212, a communication circuit 213, or a sensing circuit 214.

According to various embodiments, the power transmission circuit 211 may include a power adapter 211*a* that receives power from the outside and appropriately converts the voltage of the received power, a power generation circuit 211*b* that generates power, or a matching circuit 211*c* that increases transmission efficiency between a transmission (TX) coil 211L and a reception (RX) coil 221L.

According to various embodiments, the control circuit 212 may provide overall control to the electronic device 101. The control circuit 212 may generate and transmit various messages (e.g., instructions) required for wireless power transmission to the communication circuit 213. In an embodiment, the control circuit 212 may calculate power (or an amount of power) to be transmitted to the wireless power reception device 195 based on information received from the communication circuit 213. In an embodiment, the control circuit 212 may control the power transmission circuit 211 to transmit power generated by the TX coil 211L to the wireless power reception device 195.

According to various embodiments, the communication circuit 213 may include at least one of a first communication circuit 213*a* or a second communication circuit 213*b*. The first communication circuit 213*a* may communicate with a first communication circuit 223*a* of the wireless power reception device 195 in the IB communication scheme, for example, using a frequency identical to or adjacent to a frequency used for power transmission by the TX coil 211L.

The first communication circuit 213*a* may communicate with the first communication circuit 223*a* of the wireless power reception device 195, using the TX coil 211L. Data (or a communication signal) generated by the first communication circuit 213*a* may be transmitted using the TX coil 211L. The first communication circuit 213*a* may transmit data to the wireless power reception device 195, using the FSK modulation technique. According to various embodiments, the first communication circuit 213*a* may communicate with the first communication circuit 223*a* of the wireless power reception device 195 by changing the frequency of a power signal transmitted through the TX coil 211L. Alternatively, the first communication circuit 213*a* may communicate with the first communication circuit 223*a* of the wireless power reception device 195 by allowing data to be included in a power signal generated by the power generation circuit 211*b*. For example, the first communication circuit 213*a* may perform modulation by increasing or decreasing the frequency of the power transmission signal. The wireless power reception device 195 may identify the data from the electronic device 101 by performing demodulation based on the frequency of a signal measured by the RX coil 221L.

The second communication circuit 213*b* may communicate with a second communication circuit 223*b* of the wireless power reception device 195 in the OOB communication scheme, for example, using a frequency different from the frequency used for power transmission by the TX coil 211L. For example, the second communication circuit 213*b* may obtain information related to a charging state (e.g., a voltage value after rectification, a rectified voltage value (e.g., Vrect) information, information (e.g., Iout) about current flowing in the coil 221L or a rectifier circuit 221*b*, various packets, authentication information, and/or a message) from the second communication circuit 223*b*, using any one of various close-range communication schemes such as Bluetooth, BLE, wireless fidelity (Wi-Fi), and near field communication (NFC).

Although the electronic device 101 is shown as including one TX coil 211L in FIG. 2, the electronic device 101 may include a plurality of coils (or TX coils) according to an embodiment. For example, the electronic device 101 may transmit power to an external electronic device not mounted on the electronic device 101 or spaced apart from the electronic device 101 through a first coil (or a first TX coil). Further, the electronic device 101 may transmit power to an external electronic device mounted on the electronic device 101 through a second coil (or a second TX coil) different from the first coil.

According to various embodiments, the sensing circuit 214 may include at least one sensor and detect at least one state of the electronic device 101, using the at least one sensor.

According to various embodiments, the sensing circuit 214 may include at least one of a temperature sensor, a motion sensor, a hall sensor, or a current (or voltage) sensor, and detect a temperature state of the electronic device 101 using the temperature sensor, motion state of the electronic device 101 using the motion sensor, whether the electronic device 101 is coupled with the wireless power reception device 195, using the hall sensor, and the state of an output signal of the electronic device, for example, a current level, a voltage level, and/or a power level, using the current (or voltage) sensor.

According to an embodiment, the current (or voltage) sensor may measure a signal from the power transmission circuit 211. The current (or voltage) sensor may measure a signal in at least a partial area of the matching circuit 211*c* or the power generation circuit 211*b*. For example, the current (or voltage) sensor may include a circuit measuring a signal at a front end of the coil 211L.

According to various embodiments, the sensing circuit 214 may include a circuit for foreign object detection (FOD).

According to various embodiments, the wireless power reception device 195 may include a power reception circuit 221, a processor (or controller, control circuit) 222, a communication circuit 223, sensors 224, a display 225, or a sensing circuit 226. Sensors 224 may include the sensing circuit 226.

According to various embodiments, the power reception circuit 221 may include the RX coil 221L that wirelessly receives power from the electronic device 101, an RX IC 227, a charging circuit 221*d* (e.g., a power management IC (PMIC), a DC-DC converter, a switched capacitor, or a voltage divider), or a battery 221*e*. In an embodiment, the RX IC 227 may include a matching circuit 221*a* connected, directly or indirectly, to the RX coil 221L, the rectifier circuit 221*b* rectifying received AC power to DC power, or a regulator circuit (e.g., low-dropout (LDO)) 221*c* regulating a charging voltage.

According to various embodiments, the processor (or controller, control circuit) circuit 222 may provide overall control to the wireless power reception device 195. The processor (or controller, control circuit) 222 may generate and transmit various messages required for wireless power reception to the communication circuit 223.

According to various embodiments, the communication circuit 223 may include at least one of the first communication circuit 223a or the second communication circuit 223b. The first communication circuit 223a may communicate with the electronic device 101 through the RX coil 221L.

The first communication circuit 223a may communicate with the first communication circuit 213a of the electronic device 101, using the RX coil 221L. Data (or a communication signal) generated by the first communication circuit 223a may be transmitted using the RX coil 221L. The first communication circuit 223a may transmit data to the electronic device 101, using the ASK modulation scheme. For example, the first communication circuit 223a may cause a change in the load of the electronic device 101 according to a modulation scheme. Accordingly, at least one of the magnitudes of a voltage, current, and power measured by the TX coil 211L may be changed. The first communication circuit 213a of the electronic device 101 may identify data from the wireless power reception device 195 by demodulating the magnitude change. The second communication circuit 223b may communicate with the electronic device 101 using any one of various close-range communication schemes such as Bluetooth, BLE, Wi-Fi, or NFC.

In the disclosure, a packet, information, or data transmitted and received by the electronic device 101 and the wireless power reception device 195 may be transmitted and received through at least one of the first communication circuit 223a or the second communication circuit 223b.

According to various embodiments, the sensors 224 may include at least some of a current/voltage sensor, a temperature sensor, an illuminance sensor, or an acceleration sensor.

According to various embodiments, the sensing circuit 226 may detect the electronic device 101 by detecting a search signal or power received from the electronic device 101. The sensing circuit 226 may detect a signal change at an input/output terminal of the coil 221L, the matching circuit 221a, or the rectifier circuit 221b, caused by a signal of the coil 221L generated by a signal output from the electronic device 101. According to various embodiments, the sensing circuit 226 may also be included in the power reception circuit 221.

According to various embodiments, the display 225 may display various types of display information required for wireless power transmission and reception.

An electronic device that wirelessly transmits power according to the resonance scheme may also transmit power to an external electronic device that is not mounted on the electronic device or is spaced apart from the electronic device. However, since a coil is designed to transmit power to an external electronic device that is not mounted on the electronic device or is spaced apart from the electronic device, the efficiency of transmitting power to the external electronic device mounted on the electronic device may be reduced.

An electronic device that wirelessly transmits power in the resonance scheme according to the disclosure may include a first coil transmitting power to a first electronic device not mounted on the electronic device and a second coil transmitting power to a second electronic device mounted on the electronic device.

The electronic device of the disclosure may transmit power through the first coil to the external electronic device that is not mounted on the electronic device (or is spaced apart from the electronic device) by controlling (e.g., opening or closing) a switch included in an impedance matching circuit. Alternatively, the electronic device may transmit power through the second coil to an external electronic device mounted on the electronic device by controlling (e.g., opening or closing) the switch included in the impedance matching circuit. Accordingly, the electronic device of the disclosure may transmit power to an external electronic device spaced apart from the electronic device, and increase the efficiency of power transmission, even when transmitting power to an external electronic device mounted on the electronic device.

Figure 3A:
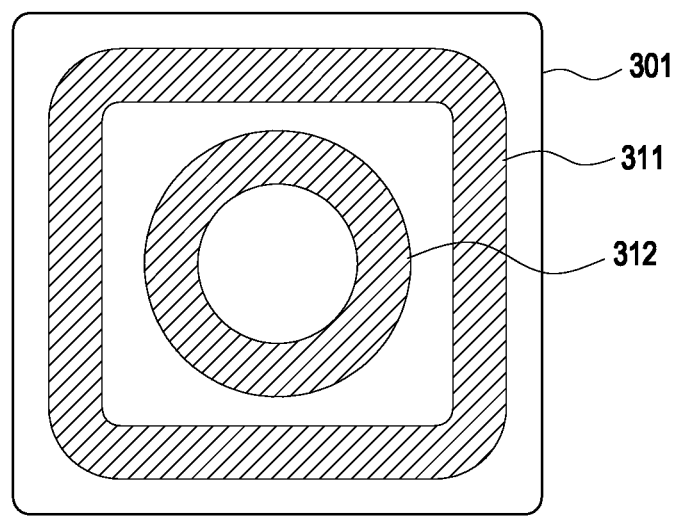
FIG. 3A is a diagram illustrating an electronic device that transmits power using a plurality of coils according to various embodiments.
Figure 3B:
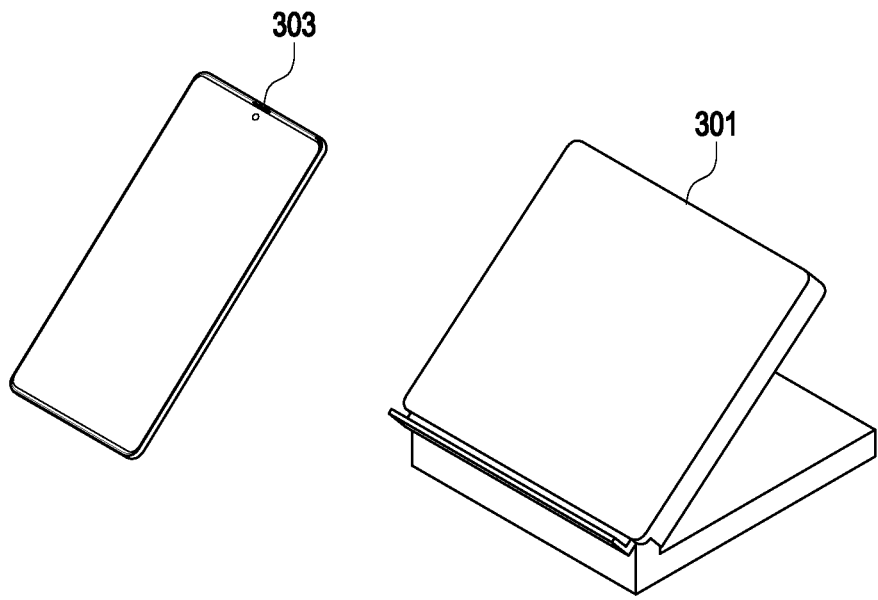
FIG. 3B is a diagram illustrating an electronic device that transmits power using a plurality of coils according to various embodiments.
Figure 3C:
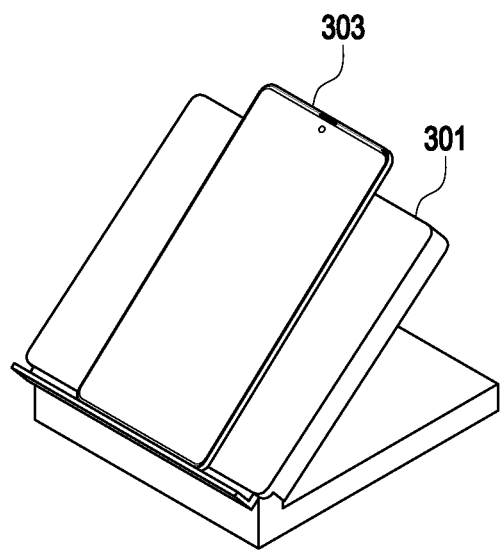
FIG. 3C is a diagram are diagrams illustrating an electronic device that transmits power using a plurality of coils according to various embodiments.

FIGS. 3A, 3B and 3C are diagrams illustrating an electronic device that transmits power using a plurality of coils according to various embodiments.

Referring to FIG. 3A, according to an embodiment, an electronic device 301 (e.g., the electronic device 101 of FIG. 1) may include a first coil 311 and a second coil 312 capable of transmitting power to an external electronic device (e.g., the wireless power reception device 195 of FIG. 1). For example, the first coil 311 and the second coil 312 may be disposed inside a housing of the electronic device 301. For example, the first coil 311 may differ from the second coil 312 in at least one of size, arrangement, and/or shape. For example, the first coil 311 may be larger than the second coil 312. For example, the second coil 312 may be disposed in an inner space at the center of the first coil 311. For example, the first coil 311 may be only connected, directly or indirectly, to the second coil 312 through a connecting member (not shown), e.g., not electrically connected to the second coil 312. The arrangement, size, and/or shape of the coils 311 and 312 illustrated in FIG. 3A are exemplary, not limiting the technical spirit of the disclosure.

Referring to FIG. 3B, according to an embodiment, when an external electronic device 303 is not mounted on or is spaced apart from the electronic device 301 (e.g., when the external electronic device 303 hovers above the electronic device 301), the electronic device 301 may wirelessly transmit power through the first coil 311.

Referring to FIG. 3C, according to an embodiment, when the external electronic device 303 is mounted on the electronic device 301, the electronic device 301 may wirelessly transmit power through the second coil 312.

Figure 4A:
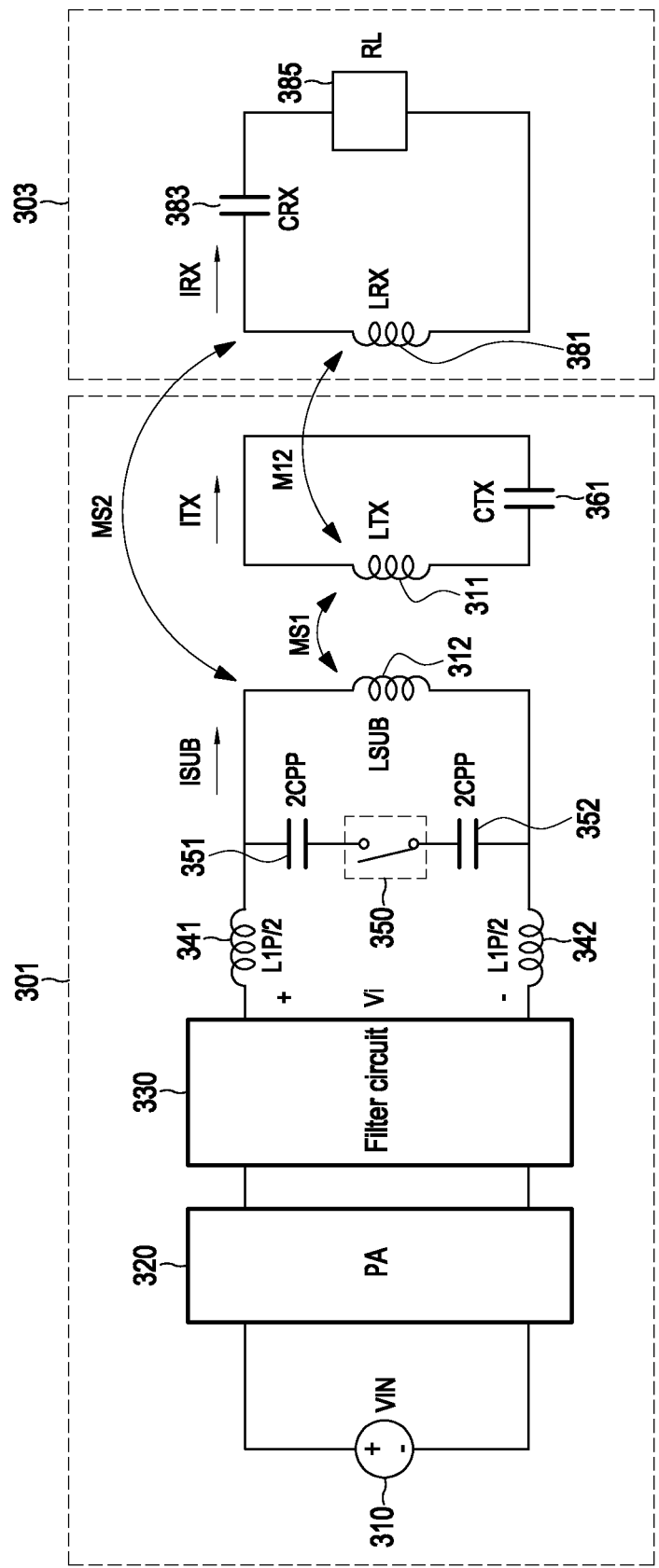
FIG. 4A is a diagram illustrating components of an electronic device and a wireless power reception device according to various embodiments.

FIG. 4A is a diagram illustrating components of an electronic device and a wireless power reception device according to various embodiments.

Referring to FIG. 4A, according to an embodiment, the electronic device 301 may include an input power source 310, a power amplifier (PA) 320, a filter circuit 330, a first inductor 341, a second inductor 342, a first capacitor 351, a second capacitor 352, a switch 350, a first coil 311, a second coil 312, and a TX capacitor 361.

According to an embodiment, the PA 320 may operate by receiving a DC voltage as a driving voltage from the input power source 310. For example, VIN may represent a voltage value of the input power source 310. According to an embodiment, the filter circuit 330 may filter a signal output from the PA 320. For example, the filter circuit 330 may be configured such that the signal output from the PA 320 has a specified harmonic frequency. For example, the filter circuit 330 may output a signal of an $n^{th}$ order harmonic frequency component (e.g., n is a natural number of 3, 5, or 7) based on the signal output from the PA 320. For example, the filter circuit 330 may include a plurality of filters. Each of the plurality of filters may include a capacitor and an inductor capable of outputting a signal of a harmonic frequency component of a corresponding order.

According to an embodiment, an LC resonant circuit (or an impedance matching circuit) may include the first inductor 341, the second inductor 342, the first capacitor 351, the second capacitor 352, the switch 350, and the second coil 312. For example, an input voltage Vi may indicate a voltage value applied to the LC resonant circuit. As the input voltage Vi is applied to the LC resonant circuit, a current ISUB may be conducted in the second coil 312. Further, as the current ISUB is conducted in the second coil 312, a current ITX may be conducted in the first coil 311. A current IRX may be conducted in an RX coil 381 based on the current ISUB conducted in the second coil 312 and the current ITX conducted in the first coil 311.

According to an embodiment, the first inductor 341 and the second inductor 342 may have the same inductance value L1P/2. Further, the first inductor 341 and the second inductor 342 may be connected in series. For example, the sum L1P of the inductances of the first inductor 341 and the second inductor 342 connected in series may be equal to an inductance value LSUB of the second coil 312. The first capacitor 351 and the second capacitor 352 may have the same capacitance value 2CPP. Further, the first capacitor 351 and the second capacitor 352 may be connected in series. The first capacitor 351 and the second capacitor 352 may be connected to the first inductor 341 and the second inductor 342 through the switch 350. For example, when the switch 350 is closed, the first capacitor 351 and the second capacitor 352 may be connected, directly or indirectly, to the first inductor 341 and the second inductor 342. For example, when the switch 350 is closed, the LC resonant circuit may form a T-type circuit network. Alternatively, when the switch 350 is opened, the first capacitor 351 and the second capacitor 352 may not be connected to the first inductor 341 and the second inductor 342.

According to an embodiment, LSUB may represent the inductance value of the second coil 312. CPP may represent the capacitance value of the first capacitor 351 and the second capacitor 352 connected in series. For example, the sum L1P of the inductances of the first inductor 341 and the second inductor 342 connected in series may be equal to the inductance value LSUB of the second coil 312. According to an embodiment, the element values LSUB, CPP, and L1P may be in a relationship as described in Equation 1 and Equation 2. For example, w may represent $2\pi f$ (f is the operating frequency of the input voltage Vi).

$$jwLSUB + \frac{1}{jwCPP} = 0 \quad \text{[Equation 1]}$$

$$L1P = LSUB \quad \text{[Equation 2]}$$

According to an embodiment, a TX resonant circuit may include the first coil 311 and the TX capacitor 361. LTX may represent the inductance value of the first coil 311. CTX may represent the capacitance value of the TX capacitor 361. According to an embodiment, the element values LTX and CTX of the first coil 311 and the TX capacitor 361 may be in a relationship as described in Equation 3. For example, w may represent $2\pi f$ (f is the operating frequency of the input voltage Vi).

$$jwLTX + \frac{1}{jwCTX} = 0 \quad \text{[Equation 3]}$$

According to an embodiment, the wireless power reception device 303 may include the RX coil 381, an RX capacitor 383, and a load 385. For example, the load 385 may have a resistance value RL.

An RX resonant circuit may include the RX coil 381 and the RX capacitor 383. LRX may represent the inductance value of the RX coil 381. CRX may represent the capacitance value of the RX capacitor 383. According to an embodiment, the element values LRX and CRX of the RX coil 381 and the RX capacitor 383 may be in a relationship as described in Equation 4. For example, w may represent $2\pi f$ (f is the operating frequency of the input voltage Vi).

$$jwLRX + \frac{1}{jwCRX} = 0 \quad \text{[Equation 4]}$$

According to an embodiment, the electronic device 301 may control the switch 350. For example, the electronic device 301 may control the switch 350 according to whether an external electronic device to be charged is mounted on the electronic device 301. For example, when transmitting power to an external electronic device not mounted on the electronic device 301, the electronic device 301 may open the switch 350. Alternatively, when transmitting power to an external electronic device mounted on the electronic device 301, the electronic device 301 may close the switch 350.

According to an embodiment, when transmitting power to an external electronic device that is not mounted on the electronic device 301, the electronic device 301 may transmit power to the external electronic device through a first resonator including the first coil 311 by blocking the LC resonant circuit (e.g., opening the switch 350). For example, the first resonator may be implemented with the first coil 311 and the TX capacitor 361. The electronic device 301 may configure a circuit such that a high current ITX is conducted in the first coil 311 through magnetic coupling MS1 between the first coil 311 and the second coil 312. The second coil 312 (or a second resonator) may serve to supply power to the first coil 311 (or the first resonator). For example, as first magnetic coupling (e.g., MS1) between the first coil 311 and the second coil 312 is weaker and the size of the second coil 312 is smaller, the magnitude of the current ITX conducted in the first coil 311 may increase. Accordingly, the second coil 312 may be implemented in a smaller size than the first coil 311. Further, the first coil 311 and the second coil 312 may be designed to have a small mutual inductance MS1. For example, MS1 may represent a mutual inductance value of the first magnetic coupling. For example, MS1 may be in a relationship as described in Equation 5. KS1 may represent a coupling coefficient between the first coil 311 and the second coil 312.

$$MS1 = KS1\sqrt{LSUB*LTX} \quad \text{[Equation 5]}$$

According to an embodiment, when transmitting power to an external electronic device mounted on the electronic device 301, the electronic device 301 may transmit power to the external electronic device through the second resonator including the second coil 312 by using the LC resonant circuit (e.g., closing the switch 350). For example, the second resonator may be implemented with the second coil 312. The electronic device 301 may configure a circuit such that a constant current is applied to the second coil 312. The second coil 312 may be implemented in a smaller size than the first coil 311. Second magnetic coupling between the second coil 312 and the RX coil 381 may have a large strength. For example, MS2 may represent a mutual inductance value of the second magnetic coupling. For example, MS2 may be in a relationship as described in Equation 6. KS2 may represent a coupling coefficient between the second coil 312 and the RX coil 381.

$$MS2 = KS2\sqrt{LSUB*LRX} \quad \text{[Equation 6]}$$

For example, third magnetic coupling may indicate magnetic coupling between the first coil 311 and the RX coil 381. For example, M12 may represent a mutual inductance value of the third magnetic coupling. For example, MS3 may be in a relationship as described in Equation 7. K12 may represent a coupling coefficient between the first coil 311 and the RX coil 381.

$$M12 = K12\sqrt{LTX \cdot LRX} \quad \text{[Equation 7]}$$

According to an embodiment, when the electronic device 301 transmits power to an external electronic device that is not mounted on the electronic device 301, KS1 may have a value much greater than KS2, and KS2 may have a value approximately equal to K12. Further, when the electronic device 301 transmits power to an external electronic device mounted on the electronic device 301, KS2 may have a much greater value than K12, and KS1 may have a value approximately equal to KS2. The first coil 311 and the second coil 312 may be designed to satisfy the above conditions for KS1, KS2, and K12. That is, the size and arrangement of each of the first coil 311 and the second coil 312 may be determined to satisfy the above conditions.

Although the components of the electronic device 301 and the wireless power reception device 303 illustrated in FIG. 4A are implemented as resistors, inductors, and capacitors having equivalent values, the technical spirit of the disclosure is not limited thereto.

Figure 4B:
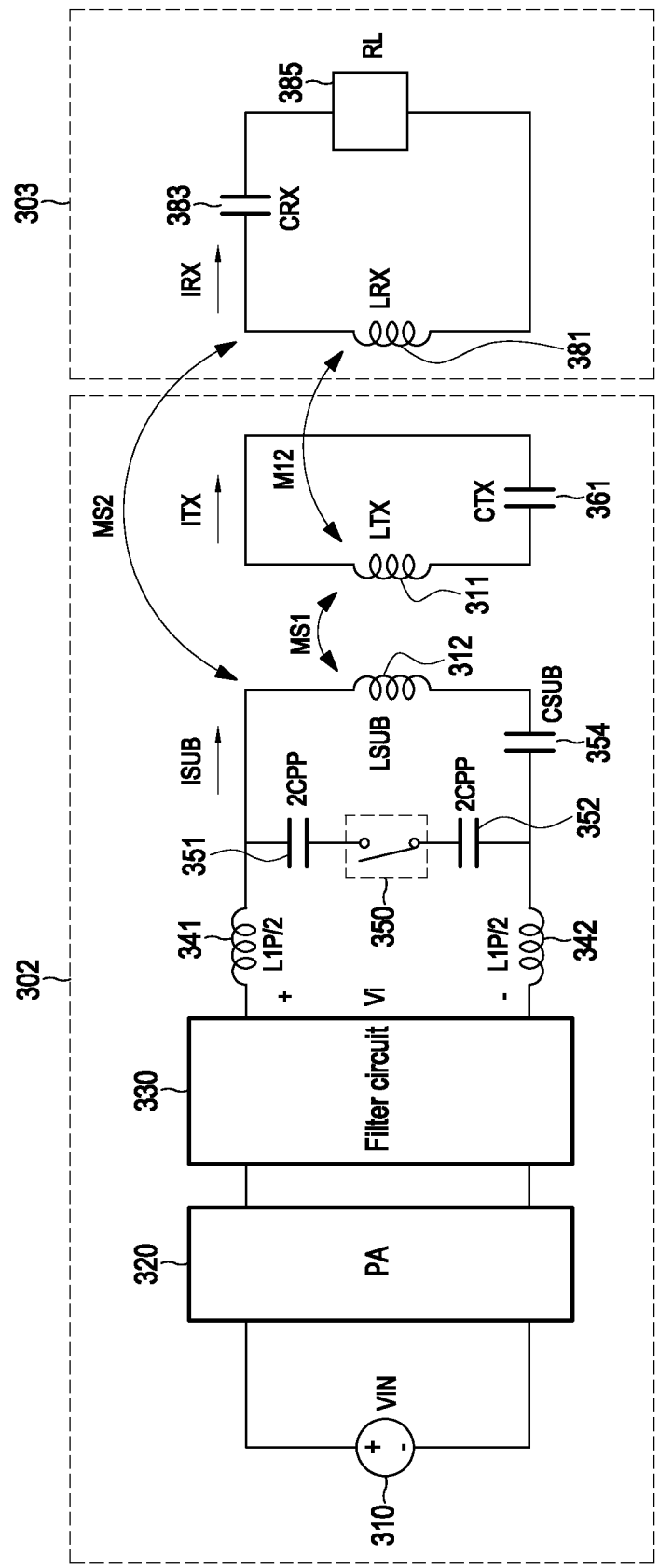
FIG. 4B is a diagram illustrating components of an electronic device and a wireless power reception device according to various embodiments.

FIG. 4B is a diagram illustrating components of an electronic device and a wireless power reception device according to various embodiments.

Referring to FIG. 4B, according to an embodiment, an electronic device 302 may further include a third capacitor 354, compared to the electronic device 301 of FIG. 4A. For example, an LC resonant circuit (or an impedance matching circuit) may include the first inductor 341, the second inductor 342, the first capacitor 351, the second capacitor 352, the third capacitor 354, the switch 350, and the second coil 312. For example, the third capacitor 354 may be connected in series to the second coil 312. For example, a second resonator may be implemented with the second coil 312 and the third capacitor 354. The third capacitor 354 may be an equivalent capacitor of the second resonator. The electronic device 302 may transmit power to an external electronic device mounted on the electronic device 301 through the second resonator. Herein, the electronic device 301 may configure a circuit such that a constant current is applied to the second resonator.

According to an embodiment, CSUB may represent the capacitance value of the third capacitor 354. LSUB may represent the inductance value of the second coil 312. CPP may represent the capacitance values of the first capacitor 351 and the second capacitor 352 connected in series. For example, the sum L1P of the inductances of the first inductor 341 and the second inductor 342 connected in series may be different from the inductance value LSUB of the second coil 312. According to an embodiment, the element values LSUB, CPP, CSUB, and L1P of the first inductor 341, the second inductor 342, the first capacitor 351, the second capacitor 352, the third capacitor 354, and the second coil 312 may be in a relationship as described in Equation 8 and Equation 9. For example, w may represent 2πf (f is the operating frequency of the input voltage Vi).

$$jwL1P = jwLSUB + \frac{1}{jwCSUB} \quad \text{[Equation 8]}$$

$$jwLSUB + \frac{1}{jwCPP} + \frac{1}{jwCSUB} = 0 \quad \text{[Equation 9]}$$

Except for the above, the electronic device 302 of FIG. 4B may be implemented the same as or similar to the electronic device 301 of FIG. 4A. However, for convenience of description, a redundant description will be avoided.

Figure 5:
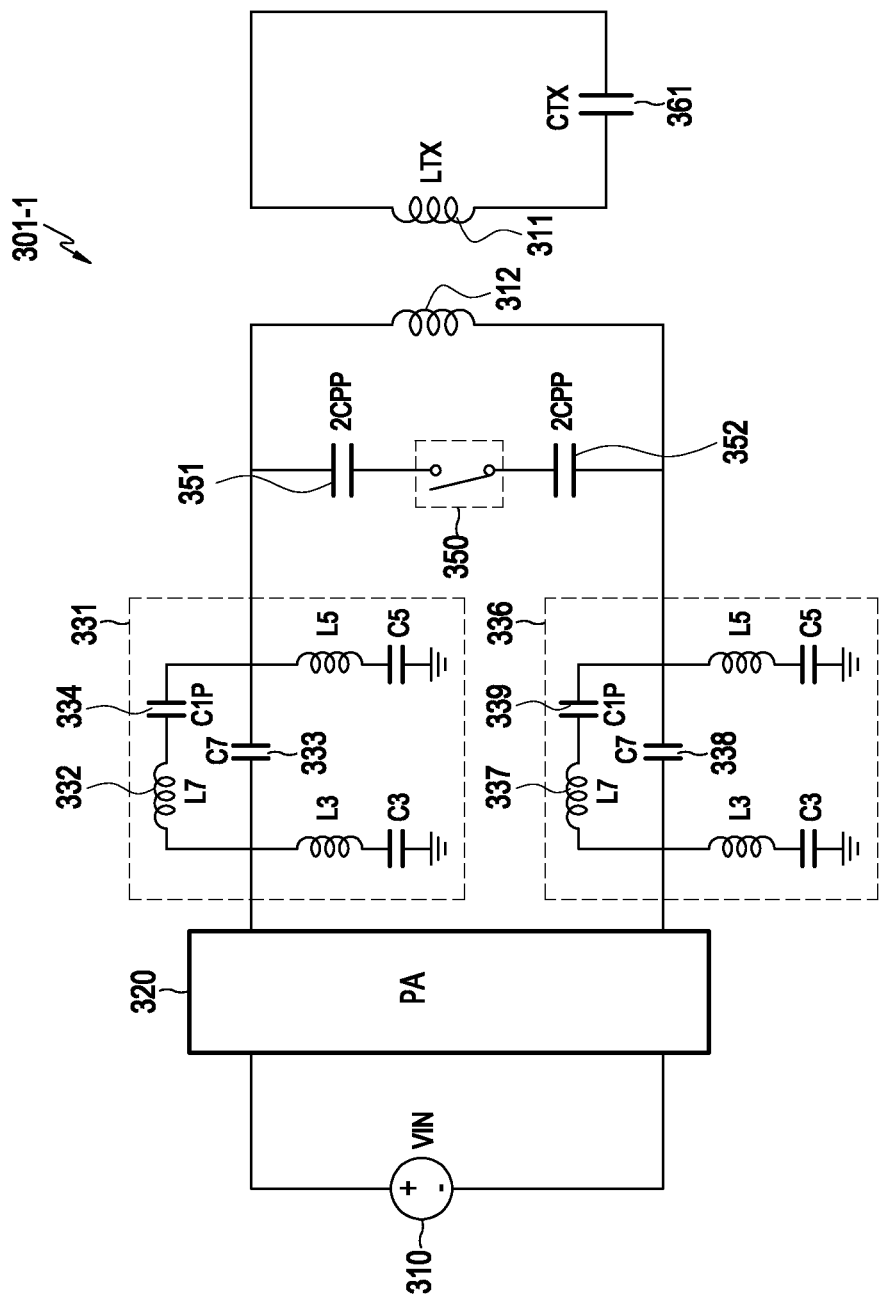
FIG. 5 is a diagram illustrating components of an electronic device according to various embodiments.

FIG. 5 is a diagram illustrating components of an electronic device according to various embodiments.

Referring to FIG. 5, according to an embodiment, an electronic device 301-1 may not include the first inductor 341 and the second inductor 342, compared to the electronic device 301 of FIG. 4A.

According to an embodiment, the electronic device 301-1 may include a first filter circuit 331 connected, directly or indirectly, to a first output terminal of the PA 320 and a second filter circuit 336 connected, directly or indirectly, to a second output terminal of the PA 320. Each of the first filter circuit 331 and the second filter circuit 336 may include an inductor L3 and a capacitor C3 (e.g., a $3^{rd}$ order harmonic frequency filter) connected in series to each other to output a $3^{rd}$ order harmonic frequency (f3=3*f), an inductor L5 and a capacitor C5 (e.g., a $5^{th}$ order harmonic frequency filter) connected in series to each other to output a $5^{th}$ order harmonic frequency (f5=5*f), and an inductor L7 332 or 337 and a capacitor C7 333 or 338 (e.g., a $7^{th}$ order harmonic frequency filter) connected in parallel to each other to output a $7^{th}$ order harmonic frequency (f7=7*f). The first filter circuit 331 may further include a capacitor 334 connected in series to the inductor 332 to output the $7^{th}$ order harmonic frequency. The second filter circuit 336 may further include a capacitor 339 connected in series to the inductor 337 to output the $7^{th}$ order harmonic frequency. That is, the capacitors 334 and 339 may be further added to the respective $7^{th}$ order harmonic frequency filters included in the first filter circuit 331 and the second filter circuit 336.

According to an embodiment, the inductors L3, L5, and L7, the capacitors C3, C5, C7, and C1P, and L1P included in each of the first filter circuit 331 and the second filter circuit 336 may be in a relationship as described in Equation 10 to Equation 13. For example, w may represent 2πf (f is the operating frequency of the input power voltage VIN).

$$j3wL3 + \frac{1}{j3wC3} = 0 \quad \text{[Equation 10]}$$

$$j5wL5 + \frac{1}{j5wC5} = 0 \quad \text{[Equation 11]}$$

$$j7wL7 + \frac{1}{j7wC7} = 0 \quad \text{[Equation 12]}$$

$$jwL7 + \frac{1}{jwC1P} = jwL1P \quad \text{[Equation 13]}$$

According to an embodiment, the first filter circuit 331 may have an impedance value equal or approximately equal to L1P/2. The second filter circuit 336 may also have an impedance value equal or approximately equal to L1P/2. For example, L1P may be equal to the inductance value of the second coil 312.

According to an embodiment, the electronic device 301-1 may equivalently implement the first inductor 341 and the second inductor 342 included in the LC resonant circuit of FIG. 4A through the first filter circuit 331 and the second filter circuit 336. Accordingly, the electronic device 301-1 may implement an LC resonant circuit equivalent to the LC resonant circuit of FIG. 4A by adding one capacitor 334 or 339 to each of the first filter circuit 331 and the second filter circuit 336.

According to an embodiment, the technical feature that the first inductor 341 and the second inductor 342 are equivalently implemented through the first filter circuit 331 and the second filter circuit 336 described with reference to FIG. 5 may be equally applied to the electronic device 302 of FIG. 4B. However, a redundant description will be avoided, for convenience of description.

According to an embodiment, an electronic device for wirelessly transmitting power according to the disclosure may be implemented as any one of the electronic device 301 illustrated in FIG. 4A, the electronic device 302 illustrated in FIG. 4B, and the electronic device 301-1 illustrated in FIG. 5.

Figure 6:
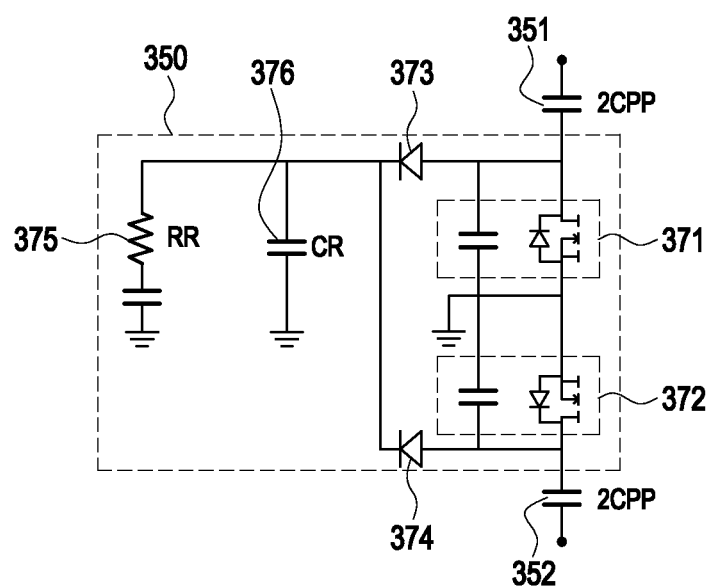
FIG. 6 is a diagram illustrating components of a switch included in an electronic device according to various embodiments.

FIG. 6 is a diagram illustrating components of a switch included in an electronic device according to various embodiments.

Referring to FIG. 6, according to an embodiment, the switch 350 may include a first metal oxide semiconductor field effect transistor (MOSFET) 371, a second MOSFET 372, a first diode 373, and a second diode 374, a resistor 375, and a capacitor 376. For example, the switch 350 may be implemented as a bidirectional switch. For example, the first MOSFET 371 and the second MOSFET 372 may be implemented as N-type MOSFETs disposed in opposite directions. For example, the electronic device 301 (or the control circuit 212) may control conduction or blocking of a current by applying a bias voltage (e.g., the input voltage Vi) to the first MOSFET 371 and/or the second MOSFET 372. For example, the first diode 373, the second diode 374, the resistor 375, and the capacitor 376 may function as a protection circuit to prevent or reduce the chance of a sudden current change, when the switch 350 is opened or closed. For example, a resistance value RR of the resistor 375 and a capacitance value CR of the capacitor 376 may be designed to have values that protect the switch 350.

FIG. 6 illustrates an example of a circuit capable of performing the function of the switch 350, to which the technical spirit of the disclosure may not be limited. For example, various circuits capable of performing the same function may be applied to the switch 350 of the disclosure.

An operation of the electronic device 301 described below may be performed or controlled by the control circuit 212. However, the following description will be given on the assumption that the electronic device 301 or 301-1 is responsible for the operation, for convenience of description.

Figure 7:
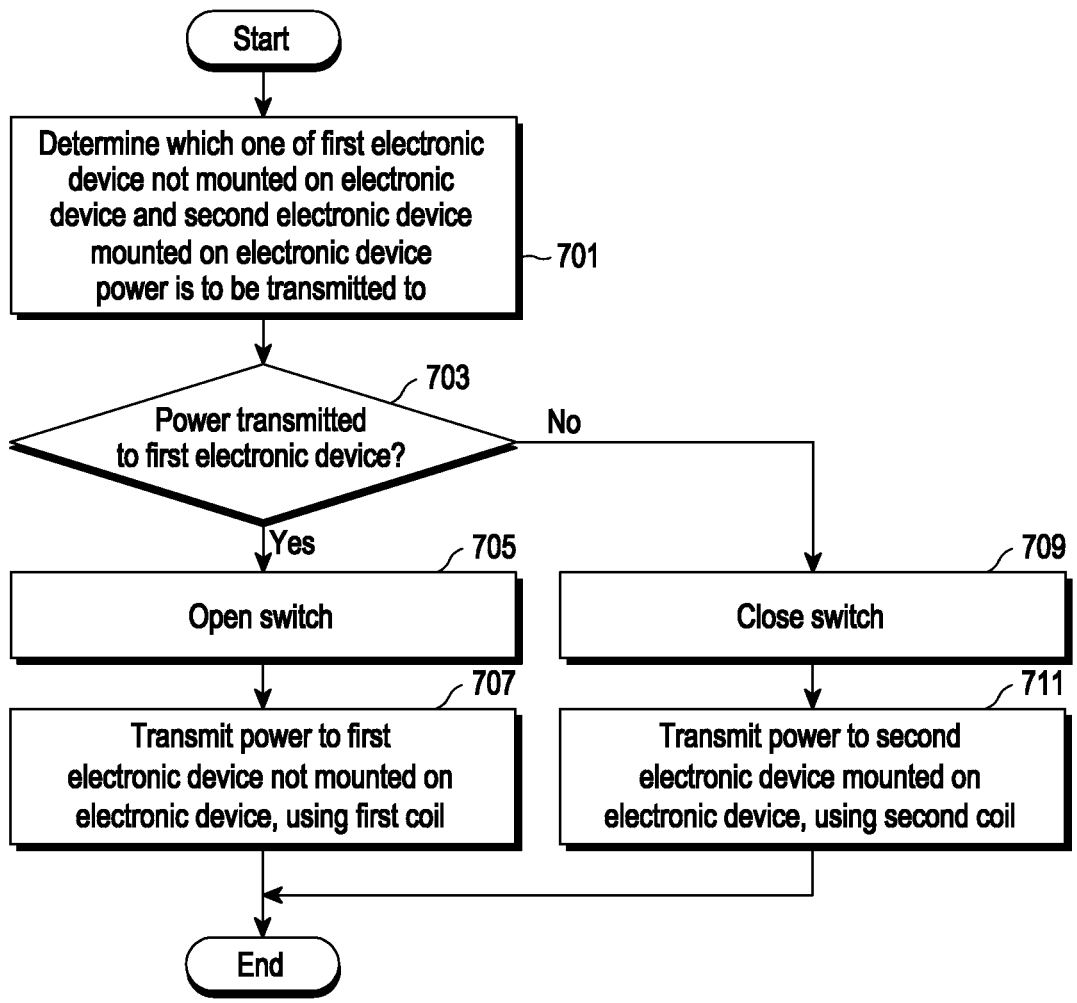
FIG. 7 is a flowchart illustrating a method of transmitting power to an external electronic device through a first coil or a second coil by an electronic device according to various embodiments.

FIG. 7 is a flowchart illustrating a method of transmitting power to an external electronic device through a first coil or a second coil by an electronic device according to various embodiments.

Referring to FIG. 7, according to an embodiment, the electronic device 301 may determine which one of a first electronic device not mounted on the electronic device 301 and a second electronic device mounted thereon power is to be transmitted to in operation 701. For example, the electronic device 301 may determine an electronic device to which power is to be transmitted according to a user's selection.

According to an embodiment, the electronic device 301 may identify whether to transmit power to the first electronic device between the first electronic device and the second electronic device in operation 703.

According to an embodiment, when identifying that power is to be transmitted to the first electronic device between the first electronic device and the second electronic device (YES in operation 703), the electronic device 301 may open the switch 350 in operation 705. In operation 707, the electronic device 301 may transmit power to the first electronic device not mounted on the electronic device 301, using the first resonator (or the first coil 311) between the first resonator including the first coil 311 and the second resonator including the second coil 312. Herein, the electronic device 301 may transmit or emit power to the first electronic device based on a current applied to the first resonator (or the first coil 311).

According to an embodiment, when identifying that power is not to be transmitted to the first electronic device between the first electronic device and the second electronic device (No in operation 703) (e.g., when identifying that power is to be transmitted to the second electronic device), the electronic device 301 may close the switch 350 in operation 709. In operation 711, the electronic device 301 may transmit power to the second electronic device mounted on the electronic device 301, using the second resonator (or the second coil 312) between the first resonator including the first coil 311 and the second resonator including the second coil 312. Herein, the electronic device 301 may transmit or emit power to the second electronic device based on a current applied to the second resonator (or the second coil 312).

According to an embodiment, the electronic device 301 may transmit power through one resonator (or coil) between the first resonator including the first coil 311 and the second resonator including the second coil 312 based on a mounting state of the external electronic device to which power is to be transmitted. For example, when the external electronic device to which power is to be transmitted is not mounted, the electronic device 301 may open the switch 350. Then, the electronic device 301 may transmit power through the first resonator (or the first coil 311). Alternatively, when the external electronic device to which power is to be transmitted is mounted, the electronic device 301 may close the switch 350. Then, the electronic device 301 may transmit power through the second resonator (or the second coil 312).

Figure 8A:
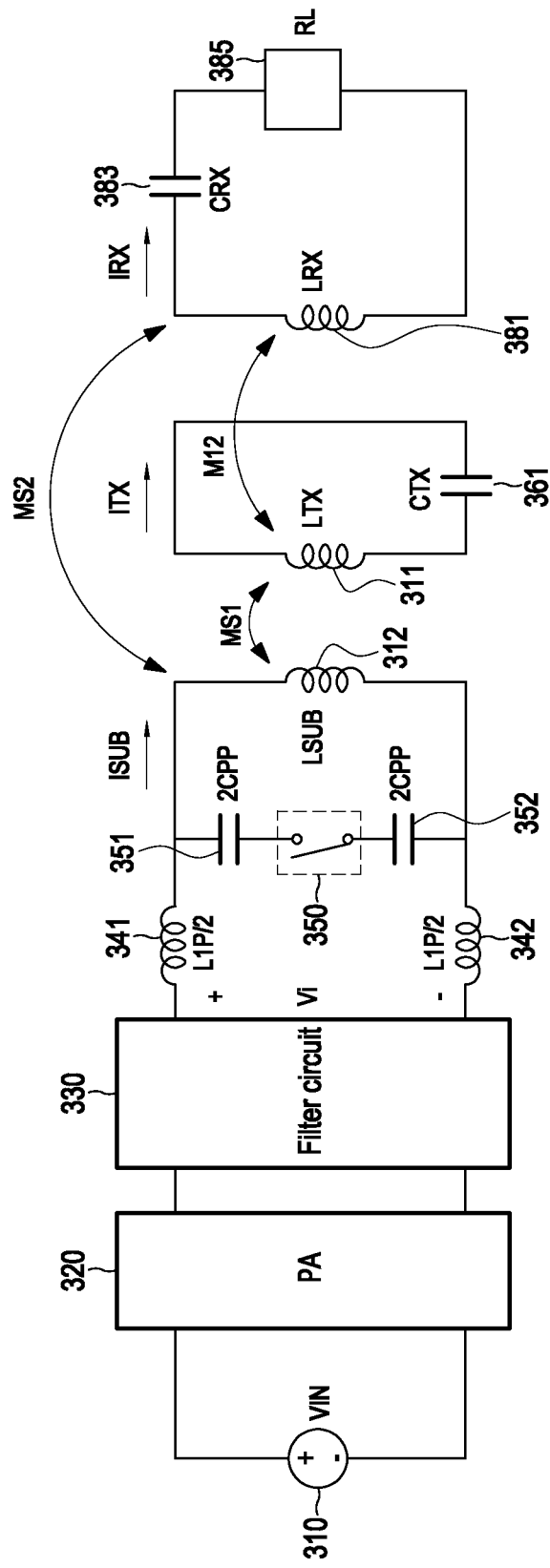
FIG. 8A is a diagram referred to for describing an operation of transmitting power to an external electronic device through a first coil by an electronic device according to various embodiments.
Figure 8B:
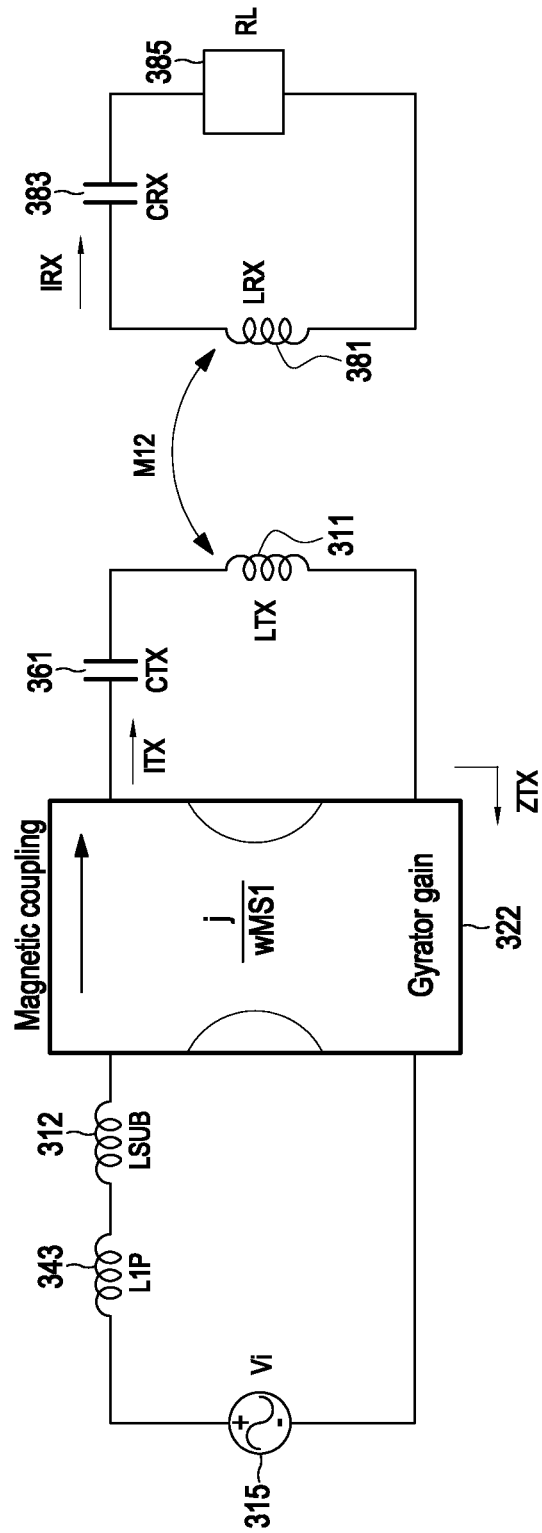
FIG. 8B is a diagram referred to for describing an operation of transmitting power to an external electronic device through a first coil by an electronic device according to various embodiments.
Figure 8C:
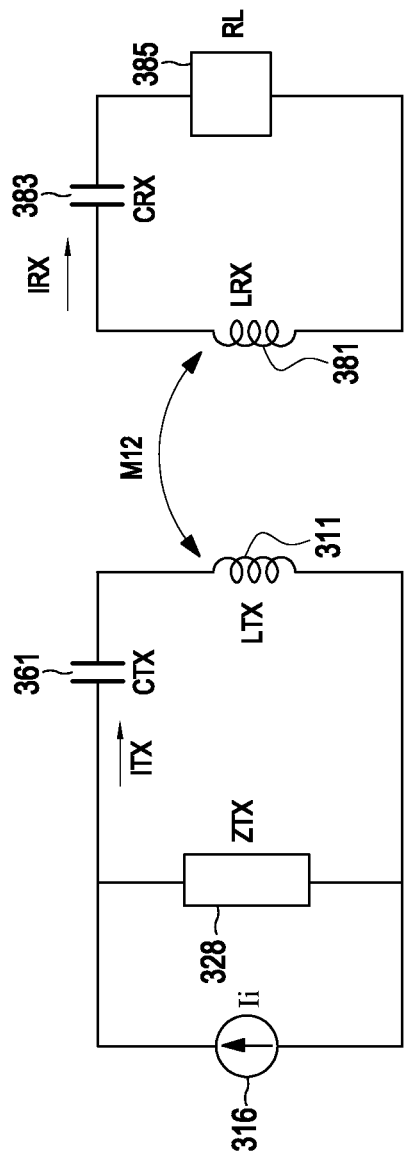
FIG. 8C is a diagram referred to for describing an operation of transmitting power to an external electronic device through a first coil by an electronic device according to various embodiments.

FIGS. 8A, 8B and 8C are diagrams referred to for describing an operation of transmitting power to an external electronic device through a first coil by an electronic device according to various embodiments.

Referring to FIG. 8A, according to an embodiment, when the electronic device 301 transmits power to an external electronic device that is not mounted on the electronic device 301 (or an external electronic device hovering above the electronic device 301), the electronic device 301 may open the switch 350. Due to the opening of the switch 350, the first capacitor 351 and the second capacitor 352 may not be connected to the first inductor 341 and the second inductor 342. Due to the opening of the switch 350, impedance transformation caused by the first capacitor 351 and the second capacitor 352 included in the LC resonant circuit may not occur. KS1 representing the first coupling coefficient between the first coil 311 and the second coil 312 may have a much greater value than KS2 representing the second coupling coefficient between the second coil 312 and the RX coil 381. Further, KS2 representing the second coupling coefficient may have a value approximately equal to K12 representing the third coupling coefficient between the first coil 311 and the RX coil 381. Accordingly, the magnetic coupling MS1 may have a greater strength than the other magnetic couplings MS2 and M12.

Referring to FIG. 8B, according to an embodiment, a gyrator 322 may be equivalently formed due to the magnetic coupling MS1 between the second coil 312 and the first coil 311. For example, a gyrator gain of the gyrator 322 may be $$\frac{j}{wMS1}.$$

Referring to FIGS. 8B and 8C, according to an embodiment, a current ITX having a large magnitude (e.g., 10A to 100A) may be conducted in the first coil 311 by the gyrator 322. For example, a current ITX corresponding to a constant current 316 may be conducted in the first coil 311 by the gyrator 322. For example, the magnitude of the constant current 316 may be based on the magnitude of an input power source 315.

According to an embodiment, the magnitude of the constant current 316 may be in a relationship as described in Equation 14.

$$Ii = \frac{jVi}{wMS1} \quad \text{[Equation 14]}$$

According to an embodiment, an equivalent impedance 328 may have a value of ZTH by voltage-current conversion, and ZTH may be in a relationship as described in Equation 15.

$$ZTX = \frac{(wMS1)^2}{jw(L1P + LSUB)} \quad \text{[Equation 15]}$$

According to an embodiment, the magnitude of the current ITX applied to the first coil 311 may be in a relationship as described in Equation 16.

$$ITX = Ii\frac{ZTX}{ZTX + jwLTX + \frac{1}{jWCTX}} \approx Ii \quad \text{[Equation 16]}$$

According to an embodiment, the current ITX conducted in the first coil 311 may be much greater than the current conducted in the second coil 312. For example, since the current ITX conducted in the first coil 311 is much greater than the current conducted in the second coil 312, the magnetic coupling MS2 between the second coil 312 and the RX coil 381 may have little or no significant effect. Based on the TX resonance relation expressions of Equation 12 to Equation 14 above, a circuit in which the constant current 316 is conducted may be implemented equivalently in the first coil 311. For example, the magnitude Ii of the constant current 316 may be based on the magnitude Vi of the input power source 315 and the magnitude MS1 of the first magnetic coupling.

According to an embodiment, the electronic device 301 may transmit power to an external electronic device that is not mounted on the electronic device 301 (or an external electronic device hovering above the electronic device 301) by conducting a current ITX with a large magnitude in the first coil 311. Herein, a strong magnetic field may be formed between the first coil 311 and the RX coil 381 due to the current ITX with the large magnitude conducted in the first coil 311. Accordingly, the electronic device 301 may transmit most of power to the external electronic device through the first resonator (or the first coil 311).

Figure 9A:
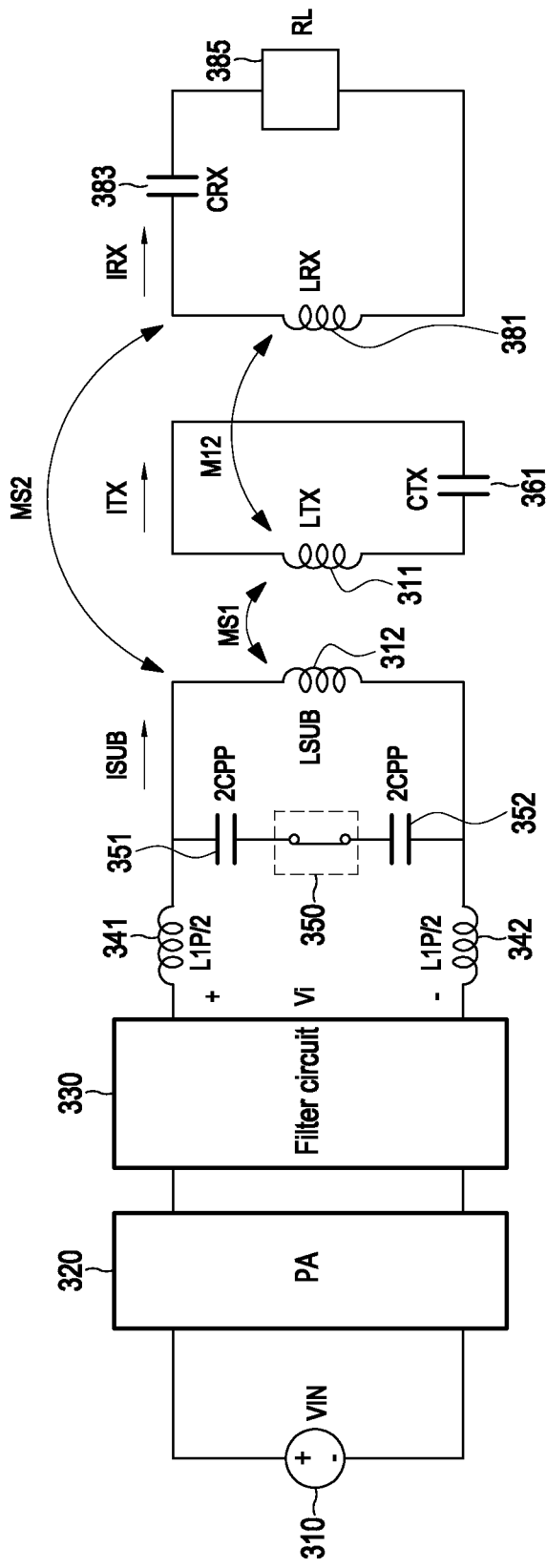
FIG. 9A is a diagram referred to for describing an operation of transmitting power to an external electronic device through a second coil by an electronic device according to various embodiments.
Figure 9B:
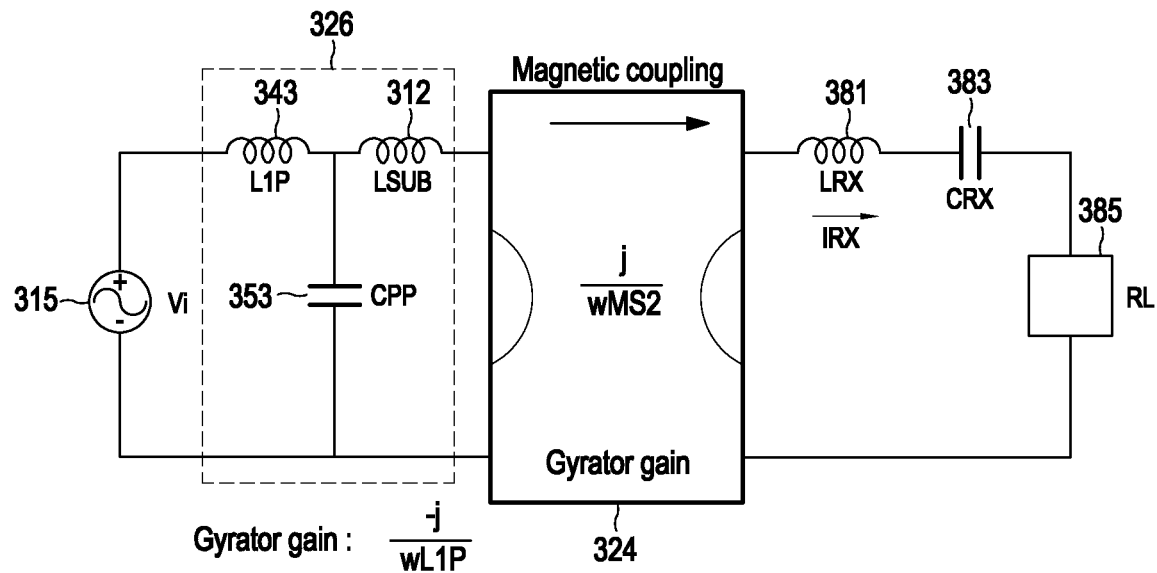
FIG. 9B is a diagram referred to for describing an operation of transmitting power to an external electronic device through a second coil by an electronic device according to various embodiments.
Figure 9C:
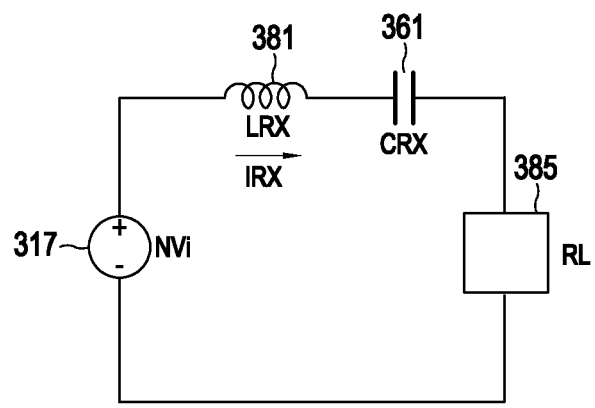
FIG. 9C is a diagram referred to for describing an operation of transmitting power to an external electronic device through a second coil by an electronic device according to various embodiments.

FIGS. 9A, 9B and 9C are diagrams referred to for describing an operation of transmitting power to an external electronic device through a second coil by an electronic device according to various embodiments.

Referring to FIG. 9A, according to an embodiment, when transmitting power to an external electronic device mounted on the electronic device 301, the electronic device 301 may close the switch 350. Due to the closing of the switch 350, the first capacitor 351 and the second capacitor 352 may be connected, directly or indirectly, to the first inductor 341 and the second inductor 342. Due to the closing of the switch 350, impedance transformation may occur by the first capacitor 351 and the second capacitor 352 included in the LC resonant circuit.

According to an embodiment, as the external electronic device (e.g., the wireless power reception device 195 of FIG. 2) is mounted on the electronic device 301, the second coil 312 and the RX coil 381 may be disposed to come into contact with each other. KS2 representing the second coupling coefficient between the second coil 312 and the RX coil 381 may have a much greater value than K12 representing the third coupling coefficient between the first coil 311 and the RX coil 381. Further, KS1 representing the first coupling coefficient between the first coil 311 and the second coil 312 may have a value approximately equal to KS2 representing the second coupling coefficient. Accordingly, the influence of the magnetic coupling M12 between the first coil 311 and the RX coil 381 may be little or not great.

Referring to FIG. 9B, according to an embodiment, a gyrator 324 may be equivalently formed due to the magnetic coupling MS2 between the second coil 312 and the RX coil 381. For example, a gyrator gain of the gyrator 324 may be $$\frac{j}{wMS2}.$$

According to an embodiment, an equivalent inductor 343, the second coil 312, and an equivalent capacitor 353 included in an LC resonant circuit may form a T-type circuit network (e.g., T-network). For example, the inductance value LSUB of the second coil 312 may be equal or approximately equal to the inductance value L1P of the equivalent inductor 343. For example, the T-type circuit network may form a gyrator. A gyrator gain of the T-type circuit network may be $$\frac{-j}{wL1P}.$$

The T-type circuit network and the gyrator 324 may be combined with each other to operate as an equivalent transformer.

Referring to FIGS. 9B and 9C, according to an embodiment, the current ISUB conducted in the second coil 312 may be a value obtained by multiplying Vi by the gyrator gain $$\frac{-j}{wL1P}$$

of the T-type circuit network. Further, the current ISUB conducted in the second coil 312 may be a value obtained by multiplying a voltage applied to the wireless power reception device 303 by the complex conjugate value $$\frac{-j}{wMS2}$$

of the gyrator gain of the gyrator 324. Accordingly, a voltage value NVi of a voltage 317 applied to the wireless power reception device 303 may be in a relationship of $$Vi\frac{iMS2}{LP1}.$$

For example, N may represent the turns ratio (or step-up ratio) of the equivalent transformer. Accordingly, a circuit to which the constant voltage 317 is applied may be implemented equivalently in the wireless power reception device 303.

According to an embodiment, the constant voltage 317 may be applied to the wireless power reception device 303. For example, the magnitude NVi of the constant voltage 317 may be based on the magnitude Vi of the input power source 315, the magnitude MS2 of the second magnetic coupling, and the magnitude L1P of the equivalent inductor 343.

According to an embodiment, as the external electronic device is mounted on the electronic device 301, the magnitude of the inductance LTX of the first coil 311 may be reduced due to a metal component included in the external electronic device. The magnitude of the current ITX conducted in the first coil 311 may also have a value approximate to that of the current ISUB conducted in the second coil 312. Accordingly, the electronic device 301 may transmit most of power to the external electronic device through the second resonator (or the second coil 312). Because the second coupling coefficient KS2 is much greater than the third coupling coefficient K12, and the current ITX conducted in the first coil 311 is not greater than the current ISUB conducted in the second coil 312, the magnetic coupling M12 between the first coil 311 and the RX coil 381 may have little influence.

Figure 10A:
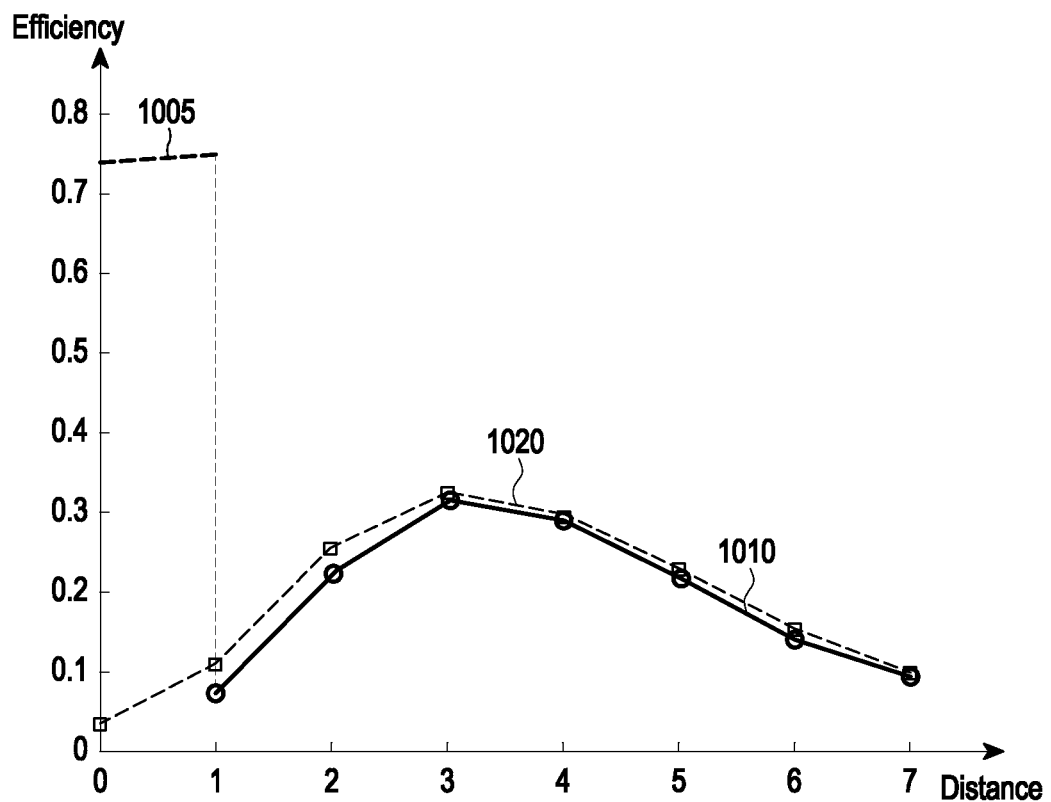
FIG. 10A is a graph illustrating the efficiency of transmitting power through a first coil or a second coil by an electronic device according to various embodiments.

FIG. 10A is a graph illustrating the efficiency of transmitting power through a first coil or a second coil by an electronic device according to various embodiments.

Referring to FIG. 10A, according to an embodiment, a first graph 1005 shows the efficiency of transmitting power to an electronic device mounted on the electronic device 301 through the second coil by the electronic device 301, after the electronic device closes the switch 350. A second graph 1010 shows the efficiency of transmitting power to an external electronic device that is not mounted on the electronic device 301 through the first coil by the electronic device 301, after the electronic device 301 opens the switch 350. A third graph 1020 shows the efficiency of transmitting power to an external electronic device that is or is not mounted on an electronic device including only one coil by the electronic device, as is done conventionally. For example, a range between a distance of 0 and a distance of 1 may indicate a range in which an external electronic device is mounted on the electronic device.

According to an embodiment, a comparison between the first graph 1005 and the third graph 1020 reveals that the electronic device 301 may have a higher efficiency of transmitting power to an external electronic device mounted on the electronic device than a power transmission efficiency of a conventional electronic device.

According to an embodiment, a comparison between the second graph 1010 and the third graph 1020 reveals that the electronic device 301 may have as high an efficiency of transmitting power to an external electronic device not mounted on the electronic device as the power transmission efficiency of the conventional electronic device.

Accordingly, the electronic device of the disclosure may significantly increase the efficiency of transmitting power to an external electronic device mounted on the electronic device, compared to the conventional electronic device.

Figure 10B:
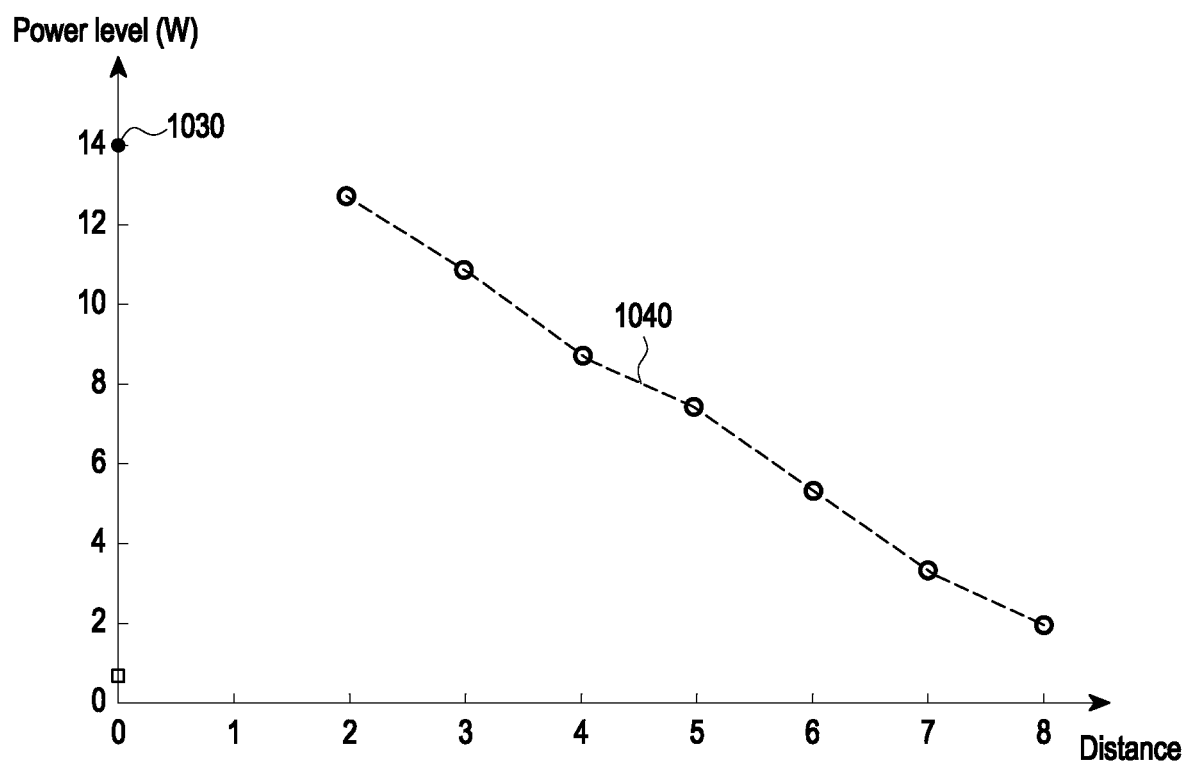
FIG. 10B is a graph illustrating the magnitude of power received from an electronic device by a wireless power reception device according to various embodiments.

FIG. 10B is a graph illustrating the magnitude of power received from an electronic device by a wireless power reception device according to various embodiments.

Referring to FIG. 10B, according to an embodiment, a fourth graph 1030 illustrates the magnitude of power (e.g., received power) transmitted to an external electronic device mounted on the electronic device 301 through the second coil by the electronic device 301, after the electronic device 301 closes the switch 350. A fifth graph 1040 illustrates the magnitude of power (e.g., received power) transmitted to an external electronic device not mounted on the electronic device 301 through the first coil by the electronic device 301, after the electronic device 301 opens the switch 350.

According to an embodiment, referring to the fourth graph 1030, the electronic device 301 may transmit power at a high level to the external electronic device mounted on the electronic device 301.

According to an embodiment, referring to the fifth graph 1040, the electronic device 301 may transmit power to the external electronic device spaced apart from the electronic device 301. In addition, the electronic device 301 may transmit power at a significant level to the external electronic device located far from the electronic device 301.

Accordingly, the electronic device 301 of the disclosure may transmit power at a higher level to the external electronic device mounted on the electronic device 301, compared to the conventional electronic device. Further, the electronic device 301 may transmit power at a significant level to the external electronic device far from the electronic device 301.

The afore-described electronic devices 101, 301, and 301-1 and the wireless power reception devices 195 and 303 may be implemented identically or similarly to the following electronic devices 1101, 1102, and 1104.

Figure 11:
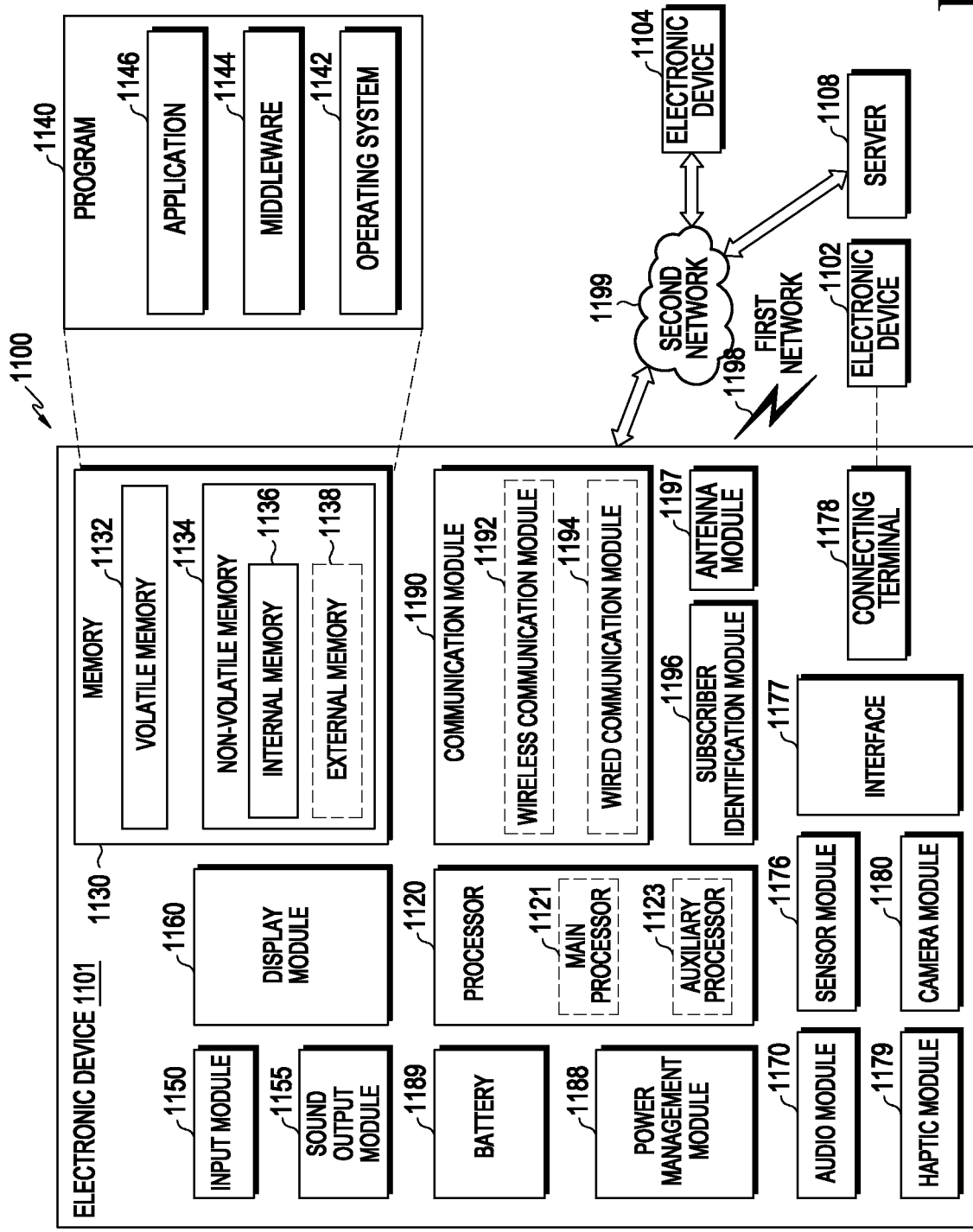
FIG. 11 is a block diagram illustrating an electronic device in a network environment according to various embodiments.

FIG. 11 is a block diagram illustrating the electronic device 1101 in a network environment 1100 according to various embodiments. Referring to FIG. 11, the electronic device 1101 in the network environment 1100 may communicate with the electronic device 1102 via a first network 1198 (e.g., a short-range wireless communication network), or at least one of the electronic device 1104 or a server 1108 via a second network 1199 (e.g., a long-range wireless communication network). According to an embodiment, the electronic device 1101 may communicate with the electronic device 1104 via the server 1108. According to an embodiment, the electronic device 1101 may include a processor 1120, memory 1130, an input module 1150, a sound output module 1155, a display module 1160, an audio module 1170, a sensor module 1176, an interface 1177, a connecting terminal 1178, a haptic module 1179, a camera module 1180, a power management module 1188, a battery 1189, a communication module 1190, a subscriber identification module (SIM) 1196, or an antenna module 1197. In some embodiments, at least one of the components (e.g., the connecting terminal 1178) may be omitted from the electronic device

1101, or one or more other components may be added in the electronic device 1101. In some embodiments, some of the components (e.g., the sensor module 1176, the camera module 1180, or the antenna module 1197) may be implemented as a single component (e.g., the display module 1160).

The processor 1120 may execute, for example, software (e.g., a program 1140) to control at least one other component (e.g., a hardware or software component) of the electronic device 1101 coupled with the processor 1120, and may perform various data processing or computation. According to an embodiment, as at least part of the data processing or computation, the processor 1120 may store a command or data received from another component (e.g., the sensor module 1176 or the communication module 1190) in volatile memory 1132, process the command or the data stored in the volatile memory 1132, and store resulting data in non-volatile memory 1134. According to an embodiment, the processor 1120 may include a main processor 1121 (e.g., a central processing unit (CPU) or an application processor (AP)), or an auxiliary processor 1123 (e.g., a graphics processing unit (GPU), a neural processing unit (NPU), an image signal processor (ISP), a sensor hub processor, or a communication processor (CP)) that is operable independently from, or in conjunction with, the main processor 1121. For example, when the electronic device 1101 includes the main processor 1121 and the auxiliary processor 1123, the auxiliary processor 1123 may be adapted to consume less power than the main processor 1121, or to be specific to a specified function. The auxiliary processor 1123 may be implemented as separate from, or as part of the main processor 1121.

The auxiliary processor 1123 may control at least some of functions or states related to at least one component (e.g., the display module 1160, the sensor module 1176, or the communication module 1190) among the components of the electronic device 1101, instead of the main processor 1121 while the main processor 1121 is in an inactive (e.g., sleep) state, or together with the main processor 1121 while the main processor 1121 is in an active state (e.g., executing an application). According to an embodiment, the auxiliary processor 1123 (e.g., an image signal processor or a communication processor) may be implemented as part of another component (e.g., the camera module 1180 or the communication module 1190) functionally related to the auxiliary processor 1123. According to an embodiment, the auxiliary processor 1123 (e.g., the neural processing unit) may include a hardware structure specified for artificial intelligence model processing. An artificial intelligence model may be generated by machine learning. Such learning may be performed, e.g., by the electronic device 1101 where the artificial intelligence is performed or via a separate server (e.g., the server 1108). Learning algorithms may include, but are not limited to, e.g., supervised learning, unsupervised learning, semi-supervised learning, or reinforcement learning. The artificial intelligence model may include a plurality of artificial neural network layers. The artificial neural network may be a deep neural network (DNN), a convolutional neural network (CNN), a recurrent neural network (RNN), a restricted boltzmann machine (RBM), a deep belief network (DBN), a bidirectional recurrent deep neural network (BRDNN), deep Q-network or a combination of two or more thereof but is not limited thereto. The artificial intelligence model may, additionally or alternatively, include a software structure other than the hardware structure.

The memory 1130 may store various data used by at least one component (e.g., the processor 1120 or the sensor module 1176) of the electronic device 1101. The various data may include, for example, software (e.g., the program 1140) and input data or output data for a command related thereto. The memory 1130 may include the volatile memory 1132 or the non-volatile memory 1134.

The program 1140 may be stored in the memory 1130 as software, and may include, for example, an operating system (OS) 1142, middleware 1144, or an application 1146.

The input module 1150 may receive a command or data to be used by another component (e.g., the processor 1120) of the electronic device 1101, from the outside (e.g., a user) of the electronic device 1101. The input module 1150 may include, for example, a microphone, a mouse, a keyboard, a key (e.g., a button), or a digital pen (e.g., a stylus pen).

The sound output module 1155 may output sound signals to the outside of the electronic device 1101. The sound output module 1155 may include, for example, a speaker or a receiver. The speaker may be used for general purposes, such as playing multimedia or playing record. The receiver may be used for receiving incoming calls. According to an embodiment, the receiver may be implemented as separate from, or as part of the speaker.

The display module 1160 may visually provide information to the outside (e.g., a user) of the electronic device 1101. The display module 1160 may include, for example, a display, a hologram device, or a projector and control circuitry to control a corresponding one of the display, hologram device, and projector. According to an embodiment, the display module 1160 may include a touch sensor adapted to detect a touch, or a pressure sensor adapted to measure the intensity of force incurred by the touch.

The audio module 1170 may convert a sound into an electrical signal and vice versa. According to an embodiment, the audio module 1170 may obtain the sound via the input module 1150, or output the sound via the sound output module 1155 or a headphone of an external electronic device (e.g., an electronic device 1102) directly (e.g., wiredly) or wirelessly coupled with the electronic device 1101.

The sensor module 1176 may detect an operational state (e.g., power or temperature) of the electronic device 1101 or an environmental state (e.g., a state of a user) external to the electronic device 1101, and then generate an electrical signal or data value corresponding to the detected state. According to an embodiment, the sensor module 1176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 1177 may support one or more specified protocols to be used for the electronic device 1101 to be coupled with the external electronic device (e.g., the electronic device 1102) directly (e.g., wiredly) or wirelessly. According to an embodiment, the interface 1177 may include, for example, a high definition multimedia interface (HDMI), a universal serial bus (USB) interface, a secure digital (SD) card interface, or an audio interface.

A connecting terminal 1178 may include a connector via which the electronic device 1101 may be physically connected with the external electronic device (e.g., the electronic device 1102). According to an embodiment, the connecting terminal 1178 may include, for example, a HDMI connector, a USB connector, a SD card connector, or an audio connector (e.g., a headphone connector).

The haptic module 1179 may convert an electrical signal into a mechanical stimulus (e.g., a vibration or a movement) or electrical stimulus which may be recognized by a user via his tactile sensation or kinesthetic sensation. According to an embodiment, the haptic module 1179 may include, for example, a motor, a piezoelectric element, or an electric stimulator.

The camera module 1180 may capture a still image or moving images. According to an embodiment, the camera module 1180 may include one or more lenses, image sensors, image signal processors, or flashes.

The power management module 1188 may manage power supplied to the electronic device 1101. According to an embodiment, the power management module 1188 may be implemented as at least part of, for example, a power management integrated circuit (PMIC).

The battery 1189 may supply power to at least one component of the electronic device 1101. According to an embodiment, the battery 1189 may include, for example, a primary cell which is not rechargeable, a secondary cell which is rechargeable, or a fuel cell.

The communication module 1190 may support establishing a direct (e.g., wired) communication channel or a wireless communication channel between the electronic device 1101 and the external electronic device (e.g., the electronic device 1102, the electronic device 1104, or the server 1108) and performing communication via the established communication channel. The communication module 1190 may include one or more communication processors that are operable independently from the processor 1120 (e.g., the application processor (AP)) and supports a direct (e.g., wired) communication or a wireless communication. According to an embodiment, the communication module 1190 may include a wireless communication module 1192 (e.g., a cellular communication module, a short-range wireless communication module, or a global navigation satellite system (GNSS) communication module) or a wired communication module 1194 (e.g., a local area network (LAN) communication module or a power line communication (PLC) module). A corresponding one of these communication modules may communicate with the external electronic device via the first network 1198 (e.g., a short-range communication network, such as Bluetooth™, wireless-fidelity (Wi-Fi) direct, or infrared data association (IrDA)) or the second network 1199 (e.g., a long-range communication network, such as a legacy cellular network, a 5G network, a next-generation communication network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 1192 may identify and authenticate the electronic device 1101 in a communication network, such as the first network 1198 or the second network 1199, using subscriber information (e.g., international mobile subscriber identity (IMSI)) stored in the subscriber identification module 1196.

The wireless communication module 1192 may support a 5G network, after a 4G network, and next-generation communication technology, e.g., new radio (NR) access technology. The NR access technology may support enhanced mobile broadband (eMBB), massive machine type communications (mMTC), or ultra-reliable and low-latency communications (URLLC). The wireless communication module 1192 may support a high-frequency band (e.g., the mmWave band) to achieve, e.g., a high data transmission rate. The wireless communication module 1192 may support various technologies for securing performance on a high-frequency band, such as, e.g., beamforming, massive multiple-input and multiple-output (massive MIMO), full dimensional MIMO (FD-MIMO), array antenna, analog beam-forming, or large scale antenna. The wireless communication module 1192 may support various requirements specified in the electronic device 1101, an external electronic device (e.g., the electronic device 1104), or a network system (e.g., the second network 1199). According to an embodiment, the wireless communication module 1192 may support a peak data rate (e.g., 20 Gbps or more) for implementing eMBB, loss coverage (e.g., 164 dB or less) for implementing mMTC, or U-plane latency (e.g., 0.5 ms or less for each of downlink (DL) and uplink (UL), or a round trip of 1 ms or less) for implementing URLLC.

The antenna module 1197 may transmit or receive a signal or power to or from the outside (e.g., the external electronic device) of the electronic device 1101. According to an embodiment, the antenna module 1197 may include an antenna including a radiating element composed of a conductive material or a conductive pattern formed in or on a substrate (e.g., a printed circuit board (PCB)). According to an embodiment, the antenna module 1197 may include a plurality of antennas (e.g., array antennas). In such a case, at least one antenna appropriate for a communication scheme used in the communication network, such as the first network 1198 or the second network 1199, may be selected, for example, by the communication module 1190 (e.g., the wireless communication module 1192) from the plurality of antennas. The signal or the power may then be transmitted or received between the communication module 1190 and the external electronic device via the selected at least one antenna. According to an embodiment, another component (e.g., a radio frequency integrated circuit (RFIC)) other than the radiating element may be additionally formed as part of the antenna module 1197.

According to various embodiments, the antenna module 1197 may form a mmWave antenna module. According to an embodiment, the mmWave antenna module may include a printed circuit board, a RFIC disposed on a first surface (e.g., the bottom surface) of the printed circuit board, or adjacent to the first surface and capable of supporting a designated high-frequency band (e.g., the mmWave band), and a plurality of antennas (e.g., array antennas) disposed on a second surface (e.g., the top or a side surface) of the printed circuit board, or adjacent to the second surface and capable of transmitting or receiving signals of the designated high-frequency band.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 1101 and the external electronic device 1104 via the server 1108 coupled with the second network 1199. Each of the electronic devices 1102 or 1104 may be a device of a same type as, or a different type, from the electronic device 1101. According to an embodiment, all or some of operations to be executed at the electronic device 1101 may be executed at one or more of the external electronic devices 1102, 1104, or 1108. For example, if the electronic device 1101 should perform a function or a service automatically, or in response to a request from a user or another device, the electronic device 1101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 1101. The electronic device 1101 may provide the outcome, with or without further processing of the outcome, as at least part of a reply to the request. To that end, a cloud computing, distributed computing, mobile edge computing (MEC), or client-server computing technology may be used, for example. The electronic device 1101 may provide ultra low-latency services using, e.g., distributed computing or mobile edge computing. In another embodiment, the external electronic device 1104 may include an internet-of-things (IoT) device. The server 1108 may be an intelligent server using machine learning and/or a neural network. According to an embodiment, the external electronic device 1104 or the server 1108 may be included in the second network 1199. The electronic device 1101 may be applied to intelligent services (e.g., smart home, smart city, smart car, or healthcare) based on 5G communication technology or IoT-related technology.

According to an embodiment, an electronic device (e.g., 101, 301, 301-1) for wirelessly transmitting power may include a first resonator including a first coil (e.g., 311), a second resonator including a second coil (e.g., 312) having a different size from the first coil, an impedance matching circuit including at least one capacitor (e.g., 351, 352, 353) connected through a switch (e.g., 350), and a controller comprising processing circuitry (e.g., 212). According to an embodiment, the controller may be configured to identify which one of a first electronic device not mounted on the electronic device and a second electronic device mounted on the electronic device power is to be transmitted to. According to an embodiment, the controller may be configured to, when power is to be transmitted to the first electronic device, transmit power through the first resonator by opening the switch. According to an embodiment, the controller may be configured to, when power is to be transmitted to the second electronic device, transmit power through the second resonator by closing the switch.

Each embodiment herein may be used in combination with any other embodiment(s) described herein.

According to an embodiment, the impedance matching circuit may further include at least one inductor (e.g., 341, 342, 343). According to an embodiment, when the switch is closed, a T-type circuit network including the at least one inductor, the at least one capacitor, and the second coil may be formed by the impedance matching circuit.

According to an embodiment, the electronic device may further include a filter circuit (e.g., 330) including a plurality of inductors and a plurality of capacitors. According to an embodiment, when the switch is closed, a T-type circuit network including the filter circuit, the at least one capacitor, and the second coil is formed by the impedance matching circuit.

According to an embodiment, a first filter among the plurality of filters included in the filter circuit may include a first capacitor (e.g., 333), a second capacitor (e.g., 334), and a first inductor (e.g., 332). According to an embodiment, the first capacitor may be connected in parallel to the first inductor, and the second capacitor may be connected in series to the first inductor.

According to an embodiment, when power is transmitted to the first electronic device through the first resonator, a current corresponding to an input voltage of the electronic device may be conducted in the first coil by magnetic coupling between the second coil and the first coil.

According to an embodiment, when power is transmitted to the first electronic device through the first resonator, a first coupling coefficient between the first coil and the second coil may be greater than a second coupling coefficient between the second coil and a third coil included in the first electronic device, and the second coupling coefficient may have a value approximately equal to a third coupling coefficient between the first coil and the third coil.

According to an embodiment, when power is transmitted to the second electronic device through the second resonator, a voltage corresponding to the input voltage of the electronic device may be provided to the second electronic device by coupling between the second coil and a reception coil of the second electronic device.

According to an embodiment, when power is transmitted to the second electronic device through the second resonator, a second coupling coefficient between the second coil and a reception coil included in the second electronic device may be greater than a third coupling coefficient between the first coil and the reception coil, and the second coupling coefficient may have a value approximately equal to the first coupling coefficient between the first coil and the second coil.

According to an embodiment, the controller (e.g., including a processor) may be configured to transmit power to the first electronic device spaced apart from the electronic device through the first resonator.

According to an embodiment, the first coil and the second coil may not be electrically connected to each other.

According to an embodiment, a method of operating an electronic device (e.g., 101, 301, 301-1) for transmitting power wirelessly may include identifying which one of a first electronic device (e.g., 195, 303) not mounted on the electronic device and a second electronic device (e.g., 195, 303) mounted on the electronic device power is to be transmitted to. The electronic device may include a first coil (e.g., 311) and a second coil (e.g., 312) having different sizes. According to an embodiment, the method of operating an electronic device for transmitting power wirelessly may include, when power is to be transmitted to the first electronic device, transmitting power through a first resonator including the first coil by opening a switch (e.g., 350) included in an impedance matching circuit included in the electronic device. The switch may be connected to at least one capacitor (e.g., 351, 352, 353). According to an embodiment, the method of operating an electronic device for transmitting power wirelessly may include, when power is to be transmitted to the second electronic device, transmitting power through a second resonator including the second coil by closing the switch.

According to an embodiment, the impedance matching circuit may further include at least one inductor (e.g., 341, 342, 343). According to an embodiment, when the switch is closed, a T-type circuit network including the at least one inductor, the at least one capacitor, and the second coil may be formed by the impedance matching circuit.

According to an embodiment, the electronic device may further include a filter circuit (e.g., 330) including a plurality of inductors and a plurality of capacitors. According to an embodiment, when the switch is closed, a T-type circuit network including the filter circuit, the at least one capacitor, and the second coil may be formed by the impedance matching circuit.

According to an embodiment, a first filter among the plurality of filters included in the filter circuit may include a first capacitor (e.g., 333), a second capacitor (e.g., 334), and a first inductor (e.g., 332). According to an embodiment, the first capacitor may be connected in parallel to the first inductor, and the second capacitor may be connected in series to the first inductor.

According to an embodiment, when power is transmitted to the first electronic device through the first resonator, a current corresponding to an input voltage of the electronic device may be conducted in the first coil by magnetic coupling between the second coil and the first coil.

According to an embodiment, when power is transmitted to the first electronic device through the first resonator, a first coupling coefficient between the first coil and the second coil may be greater than a second coupling coefficient between the second coil and a third coil included in the first electronic device, and the second coupling coefficient may have a value approximately equal to a third coupling coefficient between the first coil and the third coil.

According to an embodiment, when power is transmitted to the second electronic device through the second resonator, a voltage corresponding to the input voltage of the electronic device may be provided to the second electronic device by coupling between the second coil and a reception coil of the second electronic device.

According to an embodiment, when power is transmitted to the second electronic device through the second resonator, a second coupling coefficient between the second coil and a reception coil included in the second electronic device may be greater than a third coupling coefficient between the first coil and the reception coil, and the second coupling coefficient may have a value approximately equal to the first coupling coefficient between the first coil and the second coil.

According to an embodiment, transmitting power to the first electronic device may include transmitting power to the first electronic device spaced apart from the electronic device through the first resonator.

According to an embodiment, a non-transitory recording medium (e.g., 1130) may store instructions capable of executing identifying which one of a first electronic device (e.g., 195, 303) not mounted on an electronic device (e.g., 101, 301, 303-1) and a second electronic device (e.g., 195, 303) mounted on the electronic device power is to be transmitted to. The electronic device may include a first coil (e.g., 311) and a second coil (e.g., 312) having different sizes. According to an embodiment, the instructions may be capable of executing, when power is to be transmitted to the first electronic device, transmitting power through a first resonator including the first coil by opening a switch (e.g., 350) included in an impedance matching circuit included in the electronic device. The switch may be connected to at least one capacitor (e.g., 351, 352, 353). According to an embodiment, the instructions may be capable of executing, when power is to be transmitted to the second electronic device, transmitting power through a second resonator including the second coil by closing the switch.

The electronic device according to various embodiments may be one of various types of electronic devices. The electronic devices may include, for example, a portable communication device (e.g., a smartphone), a computer device, a portable multimedia device, a portable medical device, a camera, a wearable device, or a home appliance. According to an embodiment of the disclosure, the electronic devices are not limited to those described above.

It should be appreciated that various embodiments of the present disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B", "at least one of A and B", "at least one of A or B", "A, B, or C", "at least one of A, B, and C", and "at least one of A, B, or C", may include any one of, or all possible combinations of the items enumerated together in a corresponding one of the phrases. As used herein, such terms as "$1^{st}$" and "$2^{nd}$", or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with", "coupled to", "coupled with", or "connected to" another element (e.g., a second element), it means that the element may be coupled with the other element directly (e.g., wiredly), wirelessly, or via a third element.

As used in connection with various embodiments of the disclosure, the term "module" may include a unit implemented in hardware, software, or firmware, and may interchangeably be used with other terms, for example, logic, logic block, part, or circuitry. A module may be a single integral component, or a minimum unit or part thereof, adapted to perform one or more functions. For example, according to an embodiment, the module may be implemented in a form of an application-specific integrated circuit (ASIC). Thus, each "module" herein may comprise circuitry.

Various embodiments as set forth herein may be implemented as software (e.g., the program 1140) including one or more instructions that are stored in a storage medium (e.g., internal memory 1136 or external memory 1138) that is readable by a machine (e.g., the electronic device 1101). For example, a processor (e.g., the processor 1120) of the machine (e.g., the electronic device 1101) may invoke at least one of the one or more instructions stored in the storage medium, and execute it, with or without using one or more other components under the control of the processor. This allows the machine to be operated to perform at least one function according to the at least one instruction invoked. The one or more instructions may include a code generated by a compiler or a code executable by an interpreter. The machine-readable storage medium may be provided in the form of a non-transitory storage medium. Wherein, the term 'non-transitory' simply means that the storage medium is a tangible device, and does not include a signal (e.g., an electromagnetic wave), but this term does not differentiate between where data is semi-permanently stored in the storage medium and where the data is temporarily stored in the storage medium.

According to an embodiment, a method according to various embodiments of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., PlayStore™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to various embodiments, each component (e.g., a module or a program) of the above-described components may include a single entity or multiple entities, and some of the multiple entities may be separately disposed in different components. According to various embodiments, one or more of the above-described components may be omitted, or one or more other components may be added. Alternatively or additionally, a plurality of components (e.g., modules or programs) may be integrated into a single component. In such a case, according to various embodiments, the integrated component may still perform one or more functions of each of the plurality of components in the same or similar manner as they are performed by a corresponding one of the plurality of components before the integration. According to various embodiments, operations performed by the module, the program, or another component may be carried out sequentially, in parallel, repeatedly, or heuristically, or one or more of the operations may be executed in a different order or omitted, or one or more other operations may be added.

While the disclosure has been illustrated and described with reference to various embodiments, it will be understood that the various embodiments are intended to be illustrative, not limiting. It will further be understood by those skilled in the art that various changes in form and detail may be made without departing from the true spirit and full scope of the disclosure, including the appended claims and their equivalents. It will also be understood that any of the embodiment(s) described herein may be used in conjunction with any other embodiment(s) described herein.

The invention claimed is:

1. An electronic device for wirelessly transmitting power, comprising:
    a first resonator including a first coil;
    a second resonator including a second coil having a different size from the first coil;
    an impedance matching circuit including at least one capacitor connected through a switch; and
    a controller comprising processing circuitry,
    wherein the controller is configured to:
        identify to which of a first electronic device not mounted on the electronic device and a second electronic device mounted on the electronic device, the power is to be transmitted,
        control to transmit the power through the first resonator by opening the switch, when the power is to be transmitted to the first electronic device, and
        control to transmit the power through the second resonator by closing the switch, when the power is to be transmitted to the second electronic device,
    wherein, when the power is transmitted to the first electronic device through the first resonator, a current based on an input voltage of the electronic device is conducted in the first coil by magnetic coupling between the second coil and the first coil.

2. The electronic device of claim 1, wherein the impedance matching circuit further includes at least one inductor, and
    wherein when the switch is closed, a T-type circuit network including the at least one inductor, the at least one capacitor, and the second coil is formed by the impedance matching circuit.

3. The electronic device of claim 1, further comprising a filter circuit including a plurality of inductors and a plurality of capacitors,
    wherein when the switch is closed, a T-type circuit network including the filter circuit, the at least one capacitor, and the second coil is formed by the impedance matching circuit.

4. The electronic device of claim 3, wherein a first filter among a plurality of filters included in the filter circuit includes a first capacitor, a second capacitor, and a first inductor, and
    wherein the first capacitor is connected in parallel to the first inductor, and the second capacitor is connected in series with the first inductor.

5. The electronic device of claim 1, wherein when the power is transmitted to the first electronic device through the first resonator, the current corresponding to an input current of the electronic device is conducted in the first coil by magnetic coupling between the second coil and the first coil.

6. The electronic device of claim 1, wherein when the power is transmitted to the first electronic device through the first resonator, a first coupling coefficient between the first coil and the second coil is greater than a second coupling coefficient between the second coil and a third coil included in the first electronic device, and the second coupling coefficient has a value approximately equal to a third coupling coefficient between the first coil and the third coil.

7. The electronic device of claim 1, wherein when the power is transmitted to the second electronic device through the second resonator, a voltage corresponding to the input voltage of the electronic device is provided to the second electronic device by coupling between the second coil and a reception coil of the second electronic device.

8. The electronic device of claim 1, wherein when the power is transmitted to the second electronic device through the second resonator, a second coupling coefficient between the second coil and a reception coil included in the second electronic device is greater than a third coupling coefficient between the first coil and the reception coil, and the second coupling coefficient has a value approximately equal to a first coupling coefficient between the first coil and the second coil.

9. The electronic device of claim 1, wherein the controller is configured to transmit the power to the first electronic device spaced apart from the electronic device through the first resonator.

10. The electronic device of claim 1, wherein the first coil and the second coil are not electrically connected to each other.

11. A method of operating an electronic device for transmitting power wirelessly, the method comprising:
    identifying to which one of a first electronic device not mounted on the electronic device and a second electronic device mounted on the electronic device the power is to be transmitted, wherein the electronic device includes a first coil and a second coil of different sizes;
    when the power is to be transmitted to the first electronic device, transmitting the power through a first resonator including the first coil by a switch in an open state included in an impedance matching circuit included in the electronic device, wherein the switch is connected to at least one capacitor; and when the power is to be transmitted to the second electronic device, transmitting the power through a second resonator including the second coil by the switch in a closed state, wherein, when the power is transmitted to the first electronic device through the first resonator, a current based on an input voltage of the electronic device is conducted in the first coil by magnetic coupling between the second coil and the first coil.

12. The method of claim 11, wherein the impedance matching circuit further includes at least one inductor, and
wherein when the switch is closed, a T-type circuit network including the at least one inductor, the at least one capacitor, and the second coil is formed by the impedance matching circuit.

13. The method of claim 11, wherein the electronic device further includes a filter circuit including a plurality of inductors and a plurality of capacitors, and
wherein when the switch is closed, a T-type circuit network including the filter circuit, the at least one capacitor, and the second coil is formed by the impedance matching circuit.

14. The method of claim 13, wherein a first filter among the plurality of filters included in the filter circuit includes a first capacitor, a second capacitor, and a first inductor, and
wherein the first capacitor is connected in parallel to the first inductor, and the second capacitor is connected in series to the first inductor.

15. The method of claim 11, wherein when the power is transmitted to the first electronic device through the first resonator, the current corresponding to an input current of the electronic device is conducted in the first coil by magnetic coupling between the second coil and the first coil.

16. The method of claim 11, wherein when the power is transmitted to the first electronic device through the first resonator, a first coupling coefficient between the first coil and the second coil is greater than a second coupling coefficient between the second coil and a third coil included in the first electronic device, and the second coupling coefficient has a value approximately equal to a third coupling coefficient between the first coil and the third coil.

17. The method of claim 11, wherein when the power is transmitted to the second electronic device through the second resonator, a voltage corresponding to the input voltage of the electronic device is provided to the second electronic device by coupling between the second coil and a reception coil of the second electronic device.

18. The method of claim 11, wherein when the power is transmitted to the second electronic device through the second resonator, a second coupling coefficient between the second coil and a reception coil included in the second electronic device is greater than a third coupling coefficient between the first coil and the reception coil, and the second coupling coefficient has a value approximately equal to a first coupling coefficient between the first coil and the second coil.

19. The method of claim 11, wherein transmitting the power to the first electronic device includes transmitting the power to the first electronic device spaced apart from the electronic device through the first resonator.

20. A non-transitory recording medium storing instructions capable of executing a method, the method comprising:
identifying which one of a first electronic device not mounted on an electronic device and a second electronic device mounted on the electronic device the power is to be transmitted to, wherein the electronic device includes a first coil and a second coil having different sizes;

when the power is to be transmitted to the first electronic device, transmitting the power through a first resonator including the first coil by opening a switch included in an impedance matching circuit included in the electronic device, wherein the switch is connected to at least one capacitor; and when the power is to be transmitted to the second electronic device, transmitting power through a second resonator including the second coil by closing the switch, wherein, when the power is transmitted to the first electronic device through the first resonator, a current based on an input voltage of the electronic device is conducted in the first coil by magnetic coupling between the second coil and the first coil.

* * * * *